US005949078A

United States Patent [19]
Ooaeh et al.

[11] Patent Number: 5,949,078
[45] Date of Patent: Sep. 7, 1999

[54] CHARGED-PARTICLE-BEAM EXPOSURE DEVICE AND CHARGED-PARTICLE-BEAM EXPOSURE METHOD

[75] Inventors: Yoshihisa Ooaeh; Tomohiko Abe; Akio Yamada; Hiroshi Yasuda; Kenj Kudoh; Kouzi Takahata, all of Kawasaki, Japan

[73] Assignee: Fujitsu Limited, Kawasaki, Japan

[21] Appl. No.: 09/131,368

[22] Filed: Aug. 7, 1998

Related U.S. Application Data

[62] Division of application No. 08/908,699, Aug. 8, 1997, which is a division of application No. 08/680,960, Jul. 16, 1996, Pat. No. 5,854,490.

[30] Foreign Application Priority Data

| Oct. 3, 1995 | [JP] | Japan | 7-256397 |
| Feb. 2, 1996 | [JP] | Japan | 8-17989 |
| Mar. 19, 1996 | [JP] | Japan | 8-063512 |

[51] Int. Cl.⁶ .................................................. H01J 37/30
[52] U.S. Cl. .................................. 250/492.2; 250/398
[58] Field of Search ........................... 250/492.2, 492.23, 250/492.3, 398

[56] References Cited

U.S. PATENT DOCUMENTS

| 3,614,520 | 10/1971 | Coleman | 250/346 R |
| 4,926,055 | 5/1990 | Miyokowa | 250/423 F |
| 5,350,920 | 9/1994 | Fukuyama et al. | 250/492.21 |
| 5,650,628 | 7/1997 | Gordon et al. | 250/398 |

FOREIGN PATENT DOCUMENTS

| 59-111326 | 6/1984 | Japan. |
| 05-047643 | 2/1993 | Japan. |
| 05-160005 | 6/1993 | Japan. |
| 06-097054 | 4/1994 | Japan. |

*Primary Examiner*—Kiet T. Nguyen
*Attorney, Agent, or Firm*—Staas & Halsey

[57] ABSTRACT

An electron gun for emitting an electron beam traveling along a beam axis includes a cathode having a tip, the tip having substantially a circular conic shape and a tip surface substantially at the beam axis, the cathode being applied with a first voltage, an anode having a first aperture substantially on the beam axis and being applied with a second voltage higher than the first voltage, a control electrode having a second aperture substantially on the beam axis and being applied with a voltage lower that the first voltage to control a current of the cathode, the second aperture being larger than the tip surface, a guide electrode having a third aperture substantially on the beam axis, being arranged between the cathode and the anode, and being applied with a voltage higher than the first voltage and lower than the second voltage, the third aperture being smaller than the tip surface, and a lens electrode having a fourth aperture substantially on the beam axis, being arranged between the guide electrode and the anode, and being applied with a voltage lower than the first voltage to form a cross-over image of the electron beam, the fourth aperture being larger than the third aperture.

13 Claims, 17 Drawing Sheets

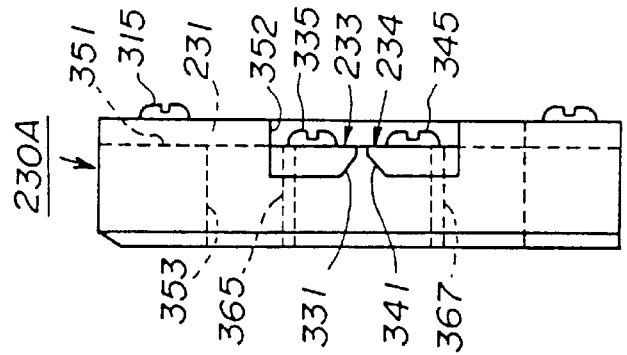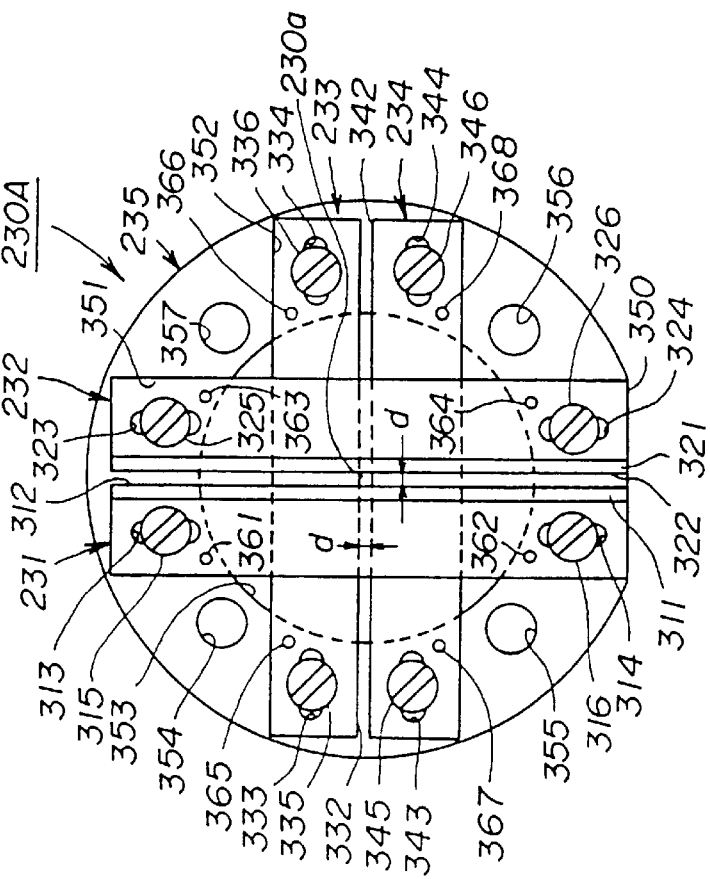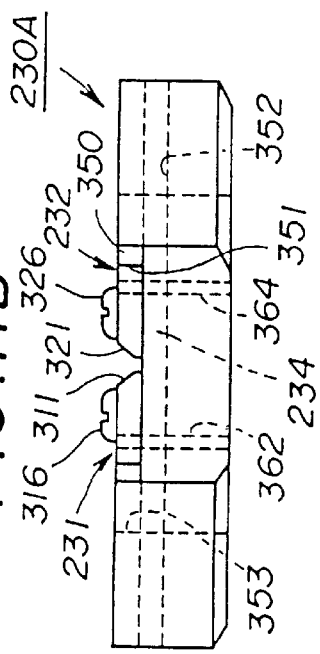

CHARGED-PARTICLE-BEAM EXPOSURE DEVICE AND CHARGED-PARTICLE-BEAM EXPOSURE METHOD

CROSS-REFERENCE TO RELATED APPLICATION

This is a divisional application of application No. 08/908,699 filed Aug. 8, 1997, now allowed, which is a divisional application of application No. 08/680,960 filed Jul. 16, 1996, now allowed, U.S. Pat. No. 5,854,490 and to both of which this application claims priority under 35 U.S.C. §120.

BACKGROUND OF THE INVENTION

1. Field of the Invention

The present invention generally relates to a device and a method for exposing an object to a charged-particle beam, and particularly relates to an improvement in an optical system configuration for the charged-particle beam.

2. Description of the Prior Art

FIG. 1 is an illustrative drawing showing a schematic configuration of a charged-particle-beam exposure device of the prior art.

The charged-particle-beam exposure device of FIG. 1 includes an electron gun 10A, electromagnetic lenses 21 through 25, a diaphragm 12 having a rectangular aperture 12a, a mask 13 having an aperture 13a, a diaphragm 14 having a round aperture 14a, a main deflector 32, a sub-deflector 33, and deflectors 26 and 34.

Between the electron gun 10A and a wafer 11 to be exposed to a charged-particle beam, the diaphragm 12, the mask 13, and the diaphragm 14 are arranged along the optical axis AX of the charged-particle beam. The electromagnetic lenses 21 through 25 are arranged such that the charged-particle beam emitted from the electron gun 10A has a cross-sectional extension as shown by a reference numeral 15. Here, the cross-sectional extension 15 of the charged-particle beam is shown enlarged in a direction perpendicular to the optical axis AX in order to clearly show the path of the charged-particle beam.

The electromagnetic lens 21 includes an electromagnetic lens 21A and an electromagnetic lens 21B arranged along both sides of the diaphragm 12. The charged-particle beam made parallel with the optical axis AX by the electromagnetic lens 21A passes through the rectangular aperture 12a of the diaphragm 12 so that the cross section of the charged-particle beam is rectangularly shaped. The electromagnetic lens 21B converges the charged-particle beam having the rectangular cross section.

The electromagnetic lens 22 includes an electromagnetic lens 22A and an electromagnetic lens 22B arranged along both sides of the mask 13. The charged-particle beam made parallel with the optical axis AX by the electromagnetic lens 22A passes through the aperture 13a of the mask 13. By the aperture 13a, the cross section of the charged-particle beam is shaped into a pattern to be formed on the wafer 11. The electromagnetic lens 22B converges the charged-particle beam passing through the aperture 13a.

The electromagnetic lens 23 forms a cross-over image of the charged-particle beam at the round aperture 14a of the diaphragm 14. The round aperture 14a of the diaphragm 14 is used for restricting an angle of the charged-particle beam incident onto the wafer 11. Also, the diaphragm 14 is used for blocking the charged-particle beam during a non-exposure period of an exposure process. The electromagnetic lens 23 and the electromagnetic lens 24 provide an image-size reduction. The electromagnetic lens 25 is an objective lens to form an image on the wafer 11.

The main deflector 32 and the sub-deflector 33 are used for scanning the charged-particle beam on the wafer 11. The deflector 34 deflects the charged-particle beam away from the round aperture 14a of the diaphragm 14 during the non-exposure period of the exposure process to block the charged-particle beam.

In a variable-rectangle exposure method, the charged-particle beam is deflected by the deflector 26 to be displaced on the mask 13. FIG. 2 is an illustrative drawing showing a displaced charged-particle beam on the mask 13. As shown in FIG. 2, a displaced cross section 15a of the charged-particle beam has a portion 16 thereof passing through the aperture 13a of the mask 13. The portion 16 is shown as a hatched region in the figure. The portion 16 passing through the aperture 13a is reduced in size to be projected onto the wafer 11. In this manner, the cross section of the charged-particle beam is shaped into a rectangle whose shape and size vary according to a voltage applied to the deflector 26.

In a block exposure method, a plurality of blocks each having a respective aperture pattern are provided on the mask 13. One of the blocks is selected, and the charged-particle beam is directed to the selected block by the deflector 26. The charged-particle beam passes through the aperture pattern of the selected block to have a cross section accordingly shaped. Then, the shaped cross-section pattern of the charged-particle beam is reduced in size to be projected onto the wafer 11. In this manner, one shot of the charged-particle beam can create a various fine pattern on the wafer 11.

In the block exposure method, an area exposed to one shot of the charged-particle beam on the mask 13 is a rectangular block including one or more apertures, and these apertures together form the aperture pattern of the block. The cross section of the charged-particle beam is shaped in advance to correspond to this rectangular block by the rectangular aperture 12a of the diaphragm 12.

FIG. 3 is an illustrative drawing showing a configuration of the electron gun 10A with a driving circuit. The electron gun 10A of FIG. 3 includes a cathode 40A, an anode 41, a Wehnelt 42A, heaters 43 and 44, leads 45 and 46, and an insulator 471. The cathode 40A has a sharply formed tip to generate a high-voltage electric field. A radius of the curvature of the tip is about 100 $\mu$m. An aperture A0 of the Wehnelt 42A has a diameter L4 of about 1.5 mm. A distance L5 between the anode 41 and the Wehnelt 42A is about 15 mm.

In order to effect a thermionic emission from the cathode 40A, a direct-current power source 50 is connected between the lead 45 and the lead 46 to heat the cathode 40A. An electron beam EB0 emitted from the cathode 40A needs to be accelerated up to a predetermined energy level. In order to effect this acceleration, a plus node of a direct-current power source 51 is connected to the anode 41 having an aperture A1 and to the ground, and a minus node of the direct-current power source 51 is connected to the lead 45 via an ammeter 52, a bias resistor 53, and a bias resistor 54, and connected to the lead 46 via the ammeter 52, the bias resistor 53, and a bias resistor 55.

A voltage level of the Wehnelt 42A is controlled by a control circuit 56 such that a cathode current I1 detected by the ammeter 52 becomes a predetermined amount. The voltage level of the Wehnelt 42A is lower than that of the cathode 40A, and the cathode current I1 supplied to the cathode 40A is controlled along with the voltage level of the Wehnelt 42A. A lens effect of the Wehnelt 42A makes the electron beam EB0 form a cross-over image CO.

The electron gun 10A described above has the following problems.

(1) Non-Uniform Distribution of Current Density

A current density of the cross section of the charged-particle beam emitted from the electron gun 10A has substantially a Gaussian distribution as shown at the top left of FIG. 1. Thus, the diaphragm 12 of FIG. 1 cuts off slopes of the Gaussian distribution, and the charged-particle beam passing through the rectangular aperture 12a of the diaphragm 12 has a non-uniform distribution. This non-uniformity of the current density distribution creates the following problems.

(a) Decrease in Accuracy of Resist Pattern

Assume that a pattern to be formed in a 5-$\mu$m-square block for one shot of the charged-particle beam has a width of 0.1 $\mu$m on the wafer 11. Because of the non-uniformity of the current density distribution, there is an error of about 0.03 $\mu$m between a pattern width at a center portion of the block and a pattern width at a perimeter portion of the block. This error restricts the fineness in which the pattern can be made.

Reducing the size of the block may reduce the amount of an error. When a side length of the rectangular aperture 12a of the diaphragm 12 as well as a side length of the block on the mask 13 is shortened by a ratio of 1/1.4, for example, the number of shots of the charged-particle beam required for forming a given pattern increases twofold. Thus, reducing the size of the block results in a significant reduction of the throughput.

(b) Damage to Diaphragm 12

Because the current-density distribution of the charged-particle beam has a Gaussian profile, most of the electron beam EB0 emitted from the electron gun 10A is blocked by the diaphragm 12 to be wasted. When a current amount input to the diaphragm 12 is 700 $\mu$A, for example, the current amount passing through the rectangular aperture 12a of the diaphragm 12 is 20 $\mu$A.

Since the electron beam EB0 is accelerated by a high voltage such as 50 KV applied between the cathode 40A and the anode 41, the diaphragm 12 generates a great amount of heat. Also, because of electrons hitting the diaphragm 12, contamination is attached to an edge of the rectangular aperture 12a of the diaphragm 12 to deform an exposure pattern.

Assume that the rectangular aperture 12a is a 150-$\mu$m square, a block on the mask 13 is a 300-$\mu$m square, and a pattern of this block gives a reduced projection of a 5-$\mu$m square on the wafer 11. If a contamination of a size of 1 $\mu$m is attached to an edge of the rectangular aperture 12a, an exposure pattern on the wafer 11 has an error of 0.03 $\mu$m (=1×5/150). If the pattern has a width of 0.1 $\mu$m, the error amounts to 30% of the width. A passage of time will accumulate the contamination. Thus, the life of the diaphragm 12 is shortened by the contamination.

(c) Damage to Mask 13

The diaphragm 12 is as thin as 20 $\mu$m around an aperture pattern in order to form a fine pattern, and is not provided in an effective heat releasing environment. The electron beam passing through the rectangular aperture 12a and yet having a high energy is directed to the mask 13. Since the current density distribution of the electron beam is non-uniform, the current amount of the electron beam is generally determined based on a current density near the perimeter of the beam cross section, where the current density is relatively low. This leads to an exposure of the mask 13 to an excessive amount of the electron beam. With this excessive current amount, the mask 13 is excessively heated by hitting electrons. The more the degree of non-uniformity, the smaller the usable maximum amount of the electron beam.

(d) Contamination due to Diaphragm 14

In general, a cross section of an electron beam tends to be expanded by the Coulomb interaction among the electrons. Because of the non-uniformity of the current density distribution, a center portion of the electron beam tends to have a current density which is excessively great. Therefore, an expansion of the beam cross section is relatively large when the beam has the non-uniformity.

The greater the expansion of the beam cross section, the less a current can pass through the round aperture 14a of the diaphragm 14. When a current amount passing through the rectangular aperture 12a of the diaphragm 12 is 20 $\mu$A, for example, the current amount passing through the round aperture 14a of the diaphragm 14 is about 10 $\mu$A. Electrons which cannot pass through the round aperture 14a cause contamination to be attached to an inside surface of the electron-beam-exposure column. Also, these electrons cause electrical charge of the electron-beam-exposure column, and this electrical charge causes a disturbance of the electrical field to vent the electron beam.

As previously described, the electron beam is deflected by the deflector 34 to be blocked by the diaphragm 14 during the non-exposure period of the exposure process. Since the beam cross section is expanded as described above, the deflection amount of the deflector 34 should be increased in order to effectively block the entire electron beam. This makes it difficult to achieve a high-speed blanking operation, and leads to a reduction of the throughput.

(2) Shortened Life of Electron Gun

Some of the positive ions generated from the diaphragm 12 or the anode 41 by the hitting of electrons are driven by the high-voltage electrical field between the anode 41 and the cathode 40A. These positive ions hit hard the tip of the cathode 40A to deform the shape of the tip. This results in a deterioration of emission characteristics of the electron beam emitted from the cathode 40A. That is, the life of the electron gun 10A is shortened.

(3) Difficulties in Adjustment of Electron Gun

Since the cathode current I1 is controlled to be constant by the control circuit 56, the voltage level of the Wehnelt 42A is varied according to a change in the tip shape and temperature of the cathode 40A. Along with a variation in the voltage level, a position of the cross-over image CO and an electron-beam-emission boundary B at the tip of the cathode 40A are changed. This leads to changes in the current density distribution on the mask 13 and in the current amount of the electron beam passing through the diaphragm 14. In order to achieve an appropriate exposure, the settings of the voltage level of the direct-current power source 51 and the cathode current I1 need to be changed accordingly. Parameters involved in the control of these settings, however, are intertwined with each other, so that the adjustment is extremely difficult.

These problems described above are present not only in the variable-rectangle method or in the block-exposure method but also in a blanking-aperture-array method, which uses in the place of the mask 13 a blanking-aperture array having a number of arranged apertures to generate a set of micro electron beams forming a desired pattern on the wafer 11.

Accordingly, there is a need for an electron gun which is easy to be adjusted, has a long life, and emits an electron beam having a relatively uniform current density distribution, and, also, a need for a charged-particle-beam exposure device and a charged-particle-beam exposure method which use this electron gun.

In the following, the problem of the damage to the mask 13 will be described in further detail.

FIG. 4A is a cross-sectional view of the mask 13 taken along a plane including the optical axis AX. The aperture 13a is formed through a thin plate of silicon by a photolithography technique. Edges of the aperture 13a can be sharpened to a fineness of an atom-size level, so that a depth of the aperture 13a in a direction of the optical axis AX can be virtually zero. When an energy of the electron beam is relatively low, a projected image of the aperture 13a on the wafer 11 is very sharp. As for dimensions, the aperture 13a is a 200-μm square, and a reduction ratio is 1/100, for example. When the portion 16 of the beam cross section (FIG. 2) is a 10-μm square, the projected image on the wafer 11 will be a 0.1-μm square.

The lower the energy of the electron beam, the greater the exposure amount by electrons forwardly scattered in a resist layer on the wafer 11 and by electrons backwardly scattered in a silicon substrate to re-enter the resist layer. Thus, the lower the energy of the electron beam, the larger the exposure area and the less concentration of the exposure-intensity distribution on the wafer 11.

In order to sharply form a fine pattern such as having a width of 0.1 μm, a high-energy electron beam such as that having an energy of 50 KV should be used. In this case, the electron beam partially penetrates through thin edges of the aperture 13a, so that a current density distribution on the wafer 11 has tapering-off slopes. FIG. 4B is an illustrative drawing showing the current density distribution on the wafer 11. The tapering off of the current density distribution on the wafer 11 leads to a reduced sharpness of the exposure pattern.

Also, there is a possibility that the mask 13 is melted by the electron beam. When this happens, the aperture 13a cannot be used any more. A reduction in the current amount of the electron beam can prevent the melting of the mask 13, but leads to a longer exposure time to assure a required exposure amount, thereby decreasing the throughput. The higher the energy of the electron beam, the smaller the exposure area on the wafer 11. Thus, a higher energy of the electron beam leads to an increased reduction in the throughput.

FIG. 4C is a cross-sectional view of an aperture formed by coating a Ta layer on the mask 13. An aperture 13b of FIG. 4C includes the mask 13 and a Ta layer 131 coated on the mask 13. Ta is a heavy metal having a high melting point, having a feature of keeping a sturdy contact with Si, and having a thermal expansion coefficient close to that of Si. Electrons of 50 KV travel 16.9 μm on average in Si before they are stopped by collisions. Whereas electrons of 50 KV travel only 2.4 μm on average in Ta. The melting point of Si is 1410° C., while that of Ta is as high as 2990° C.

When the electron beam of 50 KV is used, the electrons hit the Ta layer 131 so severely, and a slight difference in thermal expansion coefficients between the Ta layer 131 and the silicon becomes significant. As a result, the Ta layer 131 is broken off from the mask 13, so that the edges of the aperture 13a are melted by the electron beam.

Mo is known as a heavy metal having a high melting point and easily processed. When an aperture is formed through Mo, however, curvatures having a radius ranging from 10 μm to 20 μm are created at the corners of the aperture. These curvatures are out of a tolerance range of 0.5 μm.

There is a method of obviating this problem, which is disclosed in Japanese Laid-open Patent Application No. 59-111326. FIGS. 5A through 5C are illustrative drawings showing the method of creating a rectangular aperture without the aperture rounding curvatures. As shown in FIGS. 5A and 5B, a slit 132 and a slit 133 are formed through a mask 13C1 and a mask 13C2, respectively. Then, as shown in FIG. 5C, the mask 13C1 and the mask 13C2 are overlaid one over the other to form a mask 13C such that the slits 132 and 133 form a cross. The aperture 13a of the mask 13C is a sharp rectangle without curvatures at the corners.

The slits 132 and 133 should have a width in a range between 200 μm and 500 μm, and, unfortunately, such slits cannot be formed by a mechanical process. Instead of a mechanical process, a dry etching process needs to be used. Thus, the thickness of the masks 13C1 and 13C2 needs to be as thin as an order of ten μm. With this thickness, the mask 13C are too fragile, and it is difficult to mount the mask 13C to a holder without distorting the mask 13C.

Japanese Laid-open Patent Application No. 59-111326 also discloses a formation of a rectangular aperture by overlaying four Mo discs one over another. In this formation, edges of the rectangular aperture are too thick to form a sharp exposure image on the wafer.

Accordingly, there is a need for a charged-particle-beam exposure device and a charged-particle-beam exposure method which can use a high-energy-charged-particle beam to achieve a sufficient sharpness of an exposure pattern, and a need for a sturdy mask easy to be manufactured and a method of manufacturing the sturdy mask.

In the following, some of the above-identified problems will be described further in detail.

FIG. 6 is an illustrative drawing showing an exposure-column unit 110 of a charged-particle-beam exposure device of the block exposure type of the prior art.

In FIG. 6, the exposure-column unit 110 includes a charged-particle-beam generator 114 having a cathode 111, a grid (Wehnelt) 112, and an anode 113. The exposure-column unit 110 further includes a first slit 115 providing a rectangular shape to the charged particle beam, and a first lens 116 converging the shaped beam. The exposure-column unit 110 further includes second and third lenses 118 and 119 opposing each other, a mask 120 mounted movably in a horizontal direction between the second and third lenses 118 and 119.

On the mask 120 are provided a plurality of blocks having various aperture patterns. One of the blocks are selected, and first-to-fourth deflectors 121 through 124 deflect the beam to the selected block. The charged-particle beam passing through an aperture pattern of the selected block has a cross section shaped into the aperture pattern.

The exposure-column unit 110 further includes a blanking 125 blanking or passing the beam according to a blanking signal, a fourth lens 126 converging the beam, a round aperture 127, and a fifth lens 129. The exposure-column unit 110 further includes an objective lens 132 projecting the beam onto a wafer W, and a main deflector 133 and a sub-deflector 134 positioning the beam on the wafer W. The exposure-column unit 110 further includes a stage 135 carrying the wafer W to move it in horizontal directions.

The configuration of FIG. 6 can be used for the variable-rectangle method and the blanking-aperture array method by replacing the mask 120 with a respective mask.

In the charged-particle-beam exposure device of the prior art, elements restricting the current amount of the electron beam emitted from the electron-beam generator 114 include the first slit 115, the mask 120, and the round aperture 127.

The electron beam having a current amount of several hundreds of $\mu$A when emitted from the electron-beam generator 114 is partially cut off by the first slit 115, such that the electron beam passing through the first slit 115 has a current amount of several tens of $\mu$A. This electron beam with the current amount of several tens of $\mu$A is directed to the mask 120. When an applied voltage is 50 KV and the current amount is $\mu$A, for example, the mask 120 may generate heat of 1.0 W.

Among the three elements restricting the current amount of the electron beam, the first slit 115 and the round aperture 127 are made of metal such as molybdenum or tungsten. It is not likely that they are melted by heat. The mask 120 is made of silicon, however, because of a need to form fine apertures based on the semiconductor technology. Since the melting point of silicon is 1440° C., the mask 120 may be melted through heat generated by the electron beam exposure.

Thus, as previously described, the charged-particle-beam exposure device of the prior art has a problem in that the mask can be melted due to a large current amount of the electron beam.

The electron beam is also partially cut by the round aperture 127. The round aperture 127 serves to partially cut off a cross-over image to restrict an angle of the electron beam incident onto the wafer. Here, the cross-over image is an image of the electron-beam generator 114, and the partial cutting off of the electron beam at a position where the cross-over image is formed does not affect an image of the aperture pattern of the mask 120.

The round aperture 127 is also used for completely cutting (blanking) the electron beam. When the electron beam is to be blanked, the blanking 125 deflects the electron beam such that the electron beam is shifted away from the aperture of the round aperture 127. Unfortunately, the electron beam has a Gaussian distribution in the cross section thereof as described earlier. In order to shift the electron beam completely off the aperture of the round aperture 127, the blanking 125 needs to bring about a large deflection of the electron beam. Therefore, a high voltage needs to be applied to the blanking 125, leading to a difficulty in achieving a high-speed blanking operation.

Part of the electron beam cut off by the round aperture 127 is not used for exposing the wafer, and, thus, is an excessive portion. However, this excessive portion of the electron beam hinders the high-speed blanking operation.

Therefore, the charged-particle-beam exposure device of the prior art has a problem in that the excessive portion of the electron beam hinders the high-speed blanking operation.

Furthermore, an adverse effect of the excessive portion of the electron beam can be found in accumulation of contamination. The larger the current amount of the electron beam, the more likely the contamination such as dust floating in the exposure-column unit 110 is hit by electrons to be attached to various elements of the exposure-column unit 110. Also, it is more likely that charge is built up at the contamination attached to the various elements. Such a charge is not desirable since it distorts a trajectory of the electron beam.

Accordingly, there is a need for a charged-particle-beam exposure device in which an excessive portion of the electron beam is cut off to prevent the melting of elements, to enable a high-speed blanking operation, and to reduce a possibility of accumulation and charging up of contamination.

As can be seen from the previous description, the non-uniform current density distribution and high energy of the electron beam causes various compounding problems in the charged-particle-beam exposure device of the prior art.

In summary, there is a need for an electron gun which is easily adjusted, has a long life, and emits an electron beam having a relatively uniform current density distribution, and, also, a need for a charged-particle-beam exposure device and a charged-particle-beam exposure method which use this electron gun.

Also, there is a need for a charged-particle-beam exposure device and a charged-particle-beam exposure method which can use a high-energy-charged-particle beam to achieve a sufficient sharpness of an exposure pattern, and a need for a sturdy mask easy to be manufactured and a method of manufacturing such a sturdy mask.

Further, there is a need for a charged-particle-beam exposure device in which an excessive portion of the electron beam is cut off to prevent the melting of elements, to enable a high-speed blanking operation, and to reduce a possibility of accumulation and charging up of contamination.

SUMMARY OF THE INVENTION

Accordingly, it is a general object of the present invention to provide a charged-particle-beam exposure device and a charged-particle-beam exposure method which can satisfy the needs described above.

It is another and more specific object of the present invention to provide an electron gun which is easily adjusted, has a long life, and emits an electron beam having a relatively uniform current density distribution, and, also, to provide a charged-particle-beam exposure device and a charged-particle-beam exposure method which use this electron gun.

In order to achieve the above objects according to the present invention, an electron gun for emitting an electron beam traveling along a beam axis includes a cathode having a tip, the tip having substantially a circular conic shape and a tip surface substantially at a beam axis, the cathode being applied with a first voltage, an anode having a first aperture substantially on the beam axis and being applied with a second voltage higher than the first voltage, a control electrode having a second aperture substantially on the beam axis and being applied with a voltage lower than the first voltage to control a current of the cathode, the second aperture being larger than the tip surface, a guide electrode having a third aperture substantially on the beam axis, being arranged between the cathode and the anode, and being applied with a voltage higher than the first voltage and lower than the second voltage, the third aperture being smaller than the tip surface, and a lens electrode having a fourth aperture substantially on the beam axis, being arranged between the guide electrode and the anode, and being applied with a voltage lower than the first voltage to form a cross-over image of the electron beam, the fourth aperture being larger than the third aperture. The electron gun described here is also used in a charged-particle-beam exposure device and a charged-particle-beam exposure method for exposing a wafer to a charged-particle beam.

In the electron gun described above, the guide electrode has an aperture at the optical axis smaller than the tip surface of the cathode, so that the electron beam emitted from the tip and passing through the aperture has a relatively uniform distribution of the current density. Since an acceleration of electrons up to the guide electrode is much smaller than that for the anode, the heat generation at the guide electrode is relatively small. Also, even when positive ions colliding with the tip surface of the cathode deforms the shape of the cathode tip, there is little influence on the emission characteristics of the electron beam. Thus, the maintenance of the electron gun is easier, and the life thereof will be elongated. Furthermore, a change in the voltage level of the control electrode for the purpose of changing a current of the electron beam does not bring about changes in the position of the cross-over image and the shape and current density distribution of the electron beam. Since the position of the cross-over image is determined by the voltage level of the lens electrode, the adjustment of the electron gun is easier.

It is yet another object of the present invention to provide a charged-particle-beam exposure device and a charged-particle-beam exposure method which can use a high-energy-charged-particle beam to achieve a sufficient sharpness of an exposure pattern, and to provide a sturdy mask which is easily manufactured and a method of manufacturing such a sturdy mask.

In order to achieve the above objects according to the present invention, a mask having at least one aperture is used in a device for exposing a wafer to a charged-particle beam, which device passes the charged-particle beam through the at least one aperture to shape a cross section thereof before exposing the wafer to the charged-particle beam. The mask includes first through fourth plates each having an edge surface which is a remaining side surface of a corresponding one of the first through fourth plates left after beveling one of edges of a corresponding one of the first through fourth plates, and a holder on which the first through fourth plates are fixedly mounted, the first and second plates being arranged in parallel with each other with the edge surface of the first plate facing the edge surface of the second plate, the third and fourth plates being arranged in parallel with each other with the edge surface of the third plate facing the edge surface of the fourth plate, the first and second plates being arranged perpendicular to the third and fourth plates so that the edge surfaces of the first through fourth plates form a rectangular aperture as the at least one aperture of the mask.

Also, according to the present invention, a method of forming the above mask is provided. The method includes the steps of forming first through fourth plates, beveling an edge of a side surface of each of the first through fourth plates to form an edge surface which is a remaining portion of the side surface left after the beveling, and fixedly mounting the first through fourth plates on a holder, the first and second plates being arranged in parallel with each other with the edge surface of the first plate facing the edge surface of the second plate, the third and fourth plates being arranged in parallel with each other with the edge surface of the third plate facing the edge surface of the fourth plate, the first and second plates being arranged perpendicular to the third and fourth plates so that the edge surfaces of the first through fourth plates form a rectangular aperture as the at least one aperture of the mask.

In the mask described above, the plates for forming the aperture can be formed from a heavy metal having a high melting point and easily mechanically processed. Thus, the mask is easily manufactured, and a high-energy electron beam can be used. Also, use of an appropriate edge width makes it possible to provide a sufficient sharpness for an exposed pattern. Namely, the edge width can be made greater than a range which charged particles travel on average in the material used for the plates before they are stopped by collision with the material, so that the charged-particle beam does not penetrate through edges of the aperture to deteriorate sharpness of an exposed pattern. Yet, the edge width of the aperture is within a possible manufacturing range of the mechanical process, so that the edge width does not become excessively thick to dull the sharpness of the exposed pattern.

It is still another object of the present invention to provide a charged-particle-beam exposure device in which an excessive portion of the electron beam is cut off to prevent the melting of elements, to enable a high-speed blanking operation, and to reduce a possibility of accumulation and charging up of contamination.

In order to achieve the above objects according to the present invention, a device is provided which exposes a wafer to a charged-particle beam after shaping a cross section of the charged-particle beam generated from a generator by passing the charged-particle beam through at least one aperture. The device includes an electromagnetic lens for forming a cross-over image, a first plate having a round aperture for shaping a cross section of the charged-particle beam by cutting off a peripheral portion of the cross-over image, and a second plate having a beam-reduction aperture for reducing a current amount of the charged-particle beam, the second plate being located further upstream than the first plate with respect to the charged-particle beam, wherein the charged-particle beam is directed to the at least one aperture after passing through the round aperture.

In the device described above, the round aperture cuts off the peripheral portion of the cross-over image to shape the cross section of the electron beam, and the beam-reduction aperture located further upstream reduces the current amount of the electron beam so as to prevent the first plate of the round aperture from melting through heat generation. Therefore, when the electron beam passing through the round shaping aperture is directed to the mask, there is no risk that the mask is melted by heat generation. Also, since an excessive portion of the electron beam is cut off by the round aperture, the likelihood of the accumulation and charging up of the contamination is reduced.

Also, the size of the round shaping aperture can be determined such that when the electron beam shaped by the round aperture reaches an aperture for the blanking operation, the cross-sectional size of the electron beam is about the same as the size of the aperture. Therefore, when the blanking operation is conducted by deflecting the electron beam to cut off the electron beam with the round aperture, the high-speed blanking operation is achieved.

Other objects and further features of the present invention will be apparent from the following detailed description when read in conjunction with the accompanying drawings.

BRIEF DESCRIPTION OF THE DRAWINGS

FIGS. 11A through 11C are illustrative drawings showing a mask according to a second embodiment of the second principle of the present invention;

DESCRIPTION OF THE PREFERRED EMBODIMENTS

In the following, principles and embodiments of the present invention will be described with reference to the accompanying drawings.

Figure 7:
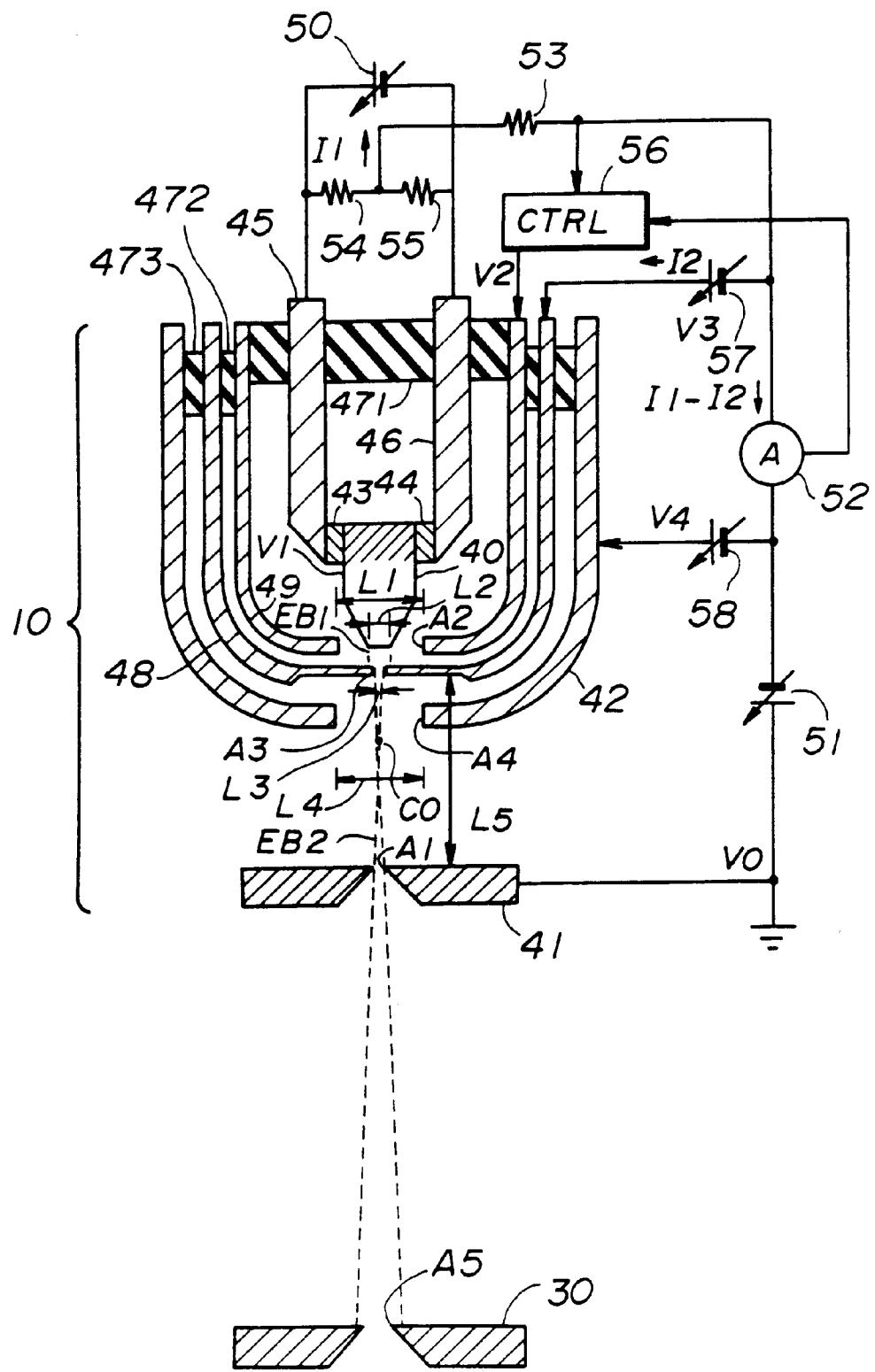
FIG. 7 is a cross-sectional view of an electron gun taken along a plane including an optical axis of an electron beam along with a driving circuit of the electron gun, according to an embodiment of a first principle.

FIG. 7 is a cross-sectional view of an electron gun 10 taken along a plane including an optical axis of the electron beam along with a driving circuit of the electron gun 10, according to an embodiment of a first principle. In FIG. 7, a scale of each element is not a reflection of a real dimension.

A cathode 40 is made of $LaB_6$, and has an upper part formed in a prism shape and a lower part formed substantially in a circular conic. Opposing the tip of the cathode 40, a guide electrode 48 is provided. The guide electrode 48 is rotationally symmetric around the optical axis, and has an aperture A3 at an intersection with the optical axis. As for dimensions, the tip of the cathode 40 has a diameter L2 of 300 $\mu$m, and a diameter L3 of the aperture A3 is 30 $\mu$m, for example.

Around the aperture A3, the guide electrode 48 has a flat portion, which is positioned in parallel with a flat surface of the tip of the cathode 40. The diameter of the tip of the cathode 40 is larger than the diameter of the aperture A3. A voltage level V3 of the guide electrode 48 is set higher than a voltage level V1 of the cathode 40 to guide an electron beam EB1 from the cathode 40.

Figure 8A:
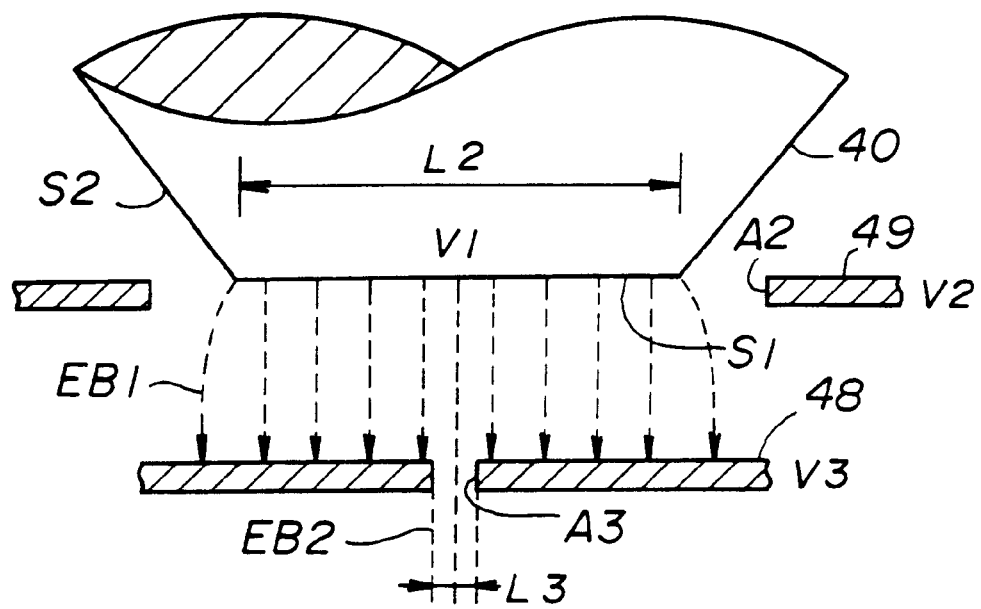
FIG. 8A is an illustrative drawing showing trajectories of electrons of an electron beam EB1 guided from a cathode to a guide electrode of FIG. 7.
Figure 8B:
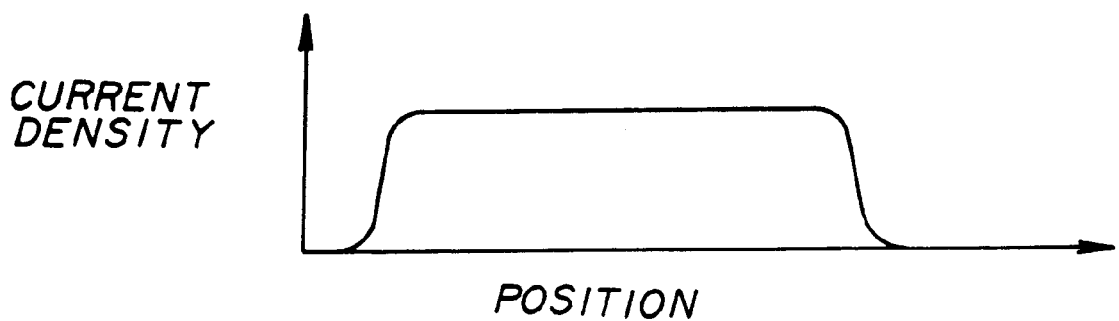
FIG. 8B is an illustrative drawing showing a current density distribution of the electron beam EB1 on a surface of the guide electrode.

FIG. 8A is an illustrative drawing showing trajectories of electrons of the electron beam EB1 guided from the cathode 40 to the guide electrode 48, and FIG. 8B is an illustrative drawing showing a current density distribution of the electron beam EB1 on the surface of the guide electrode 48.

As shown in FIG. 8A, the electrons of the electron beam EB1 have trajectories perpendicular to the flat portion of the guide electrode 48. As shown in FIG. 8B, the electron beam EB1 has an almost uniform distribution of the current density on the guide electrode 48 within an area corresponding to the diameter L2 of the cathode 40. Thus, an electron beam EB2 passing through the aperture A3 has a uniform current density distribution.

Accordingly, some of the problems described in the background of the invention are addressed as follows.

(1) An accuracy of a resist pattern obtained through the exposure process is enhanced so that a finer pattern can be created.

(2) A current amount of the electrons hitting the diaphragm 12 is significantly reduced, so that the accumulation and charging up of the contamination are reduced. Thus, the diaphragm 12 has an elongated life.

(3) Excessive electrons of the electron beam colliding with the mask 13 are reduced, so that a maximum energy cap of the electron beam for not melting the mask 13 can be set higher. Thus, the mask 13 has a elongated life.

(4) There is an increase in the ratio of the current passing through the round aperture 14a of the diaphragm 14 to the current not passing through, so that the accumulation and charging up of the contamination are reduced. Thus, a high-speed blanking operation is achieved by using the deflector 34 and the diaphragm 14.

In FIG. 7, the guide electrode 48 is positioned much closer to the cathode 40 than to the anode 41, so that it is sufficient to use the voltage level V3 of −49 KV when the voltage level V1 is −50 KV, for example. In this case, the energy of the electron beam EB1 at the guide electrode 48 is 1/50 of that at the anode 41. With this energy level, heat generated by the electron beam EB1 hitting the guide electrode 48 is relatively small.

As shown in FIG. 7, a control electrode 49 is arranged generally flush with the flat surface of the tip of the cathode 40. The control electrode 49 is provided in order to control a current amount of the electron beam EB1 emitted from a tip surface S1 of the cathode 40 (see FIG. 8A), to suppress electrons emitted from a side surface S2 of the cathode 40, and to prevent the electrons emitted from the side surface S2 to reach the guide electrode 48. The control electrode 49 is rotationally symmetric around the optical axis, and has an aperture A2 at a center thereof.

A diameter L1 of the aperture A2 is larger than the diameter L2, and may be 1 mm, for example. A voltage level V2 lower than the voltage level V1 is applied to the control electrode 49, and may be −51 KV, for example.

As shown in FIG. 7, a lens electrode 42 is arranged nearer to the guide electrode 48 between the guide electrode 48 and the anode 41 to form a cross-over image CO of the electron beam EB2 passing through the aperture A3. The lens electrode 42 is rotationally symmetric around the optical axis, and has an aperture A4 at the center thereof. The aperture A4 allows the passage of the electron beam, and may have a diameter L4 of 1 mm, for example.

Figure 3:
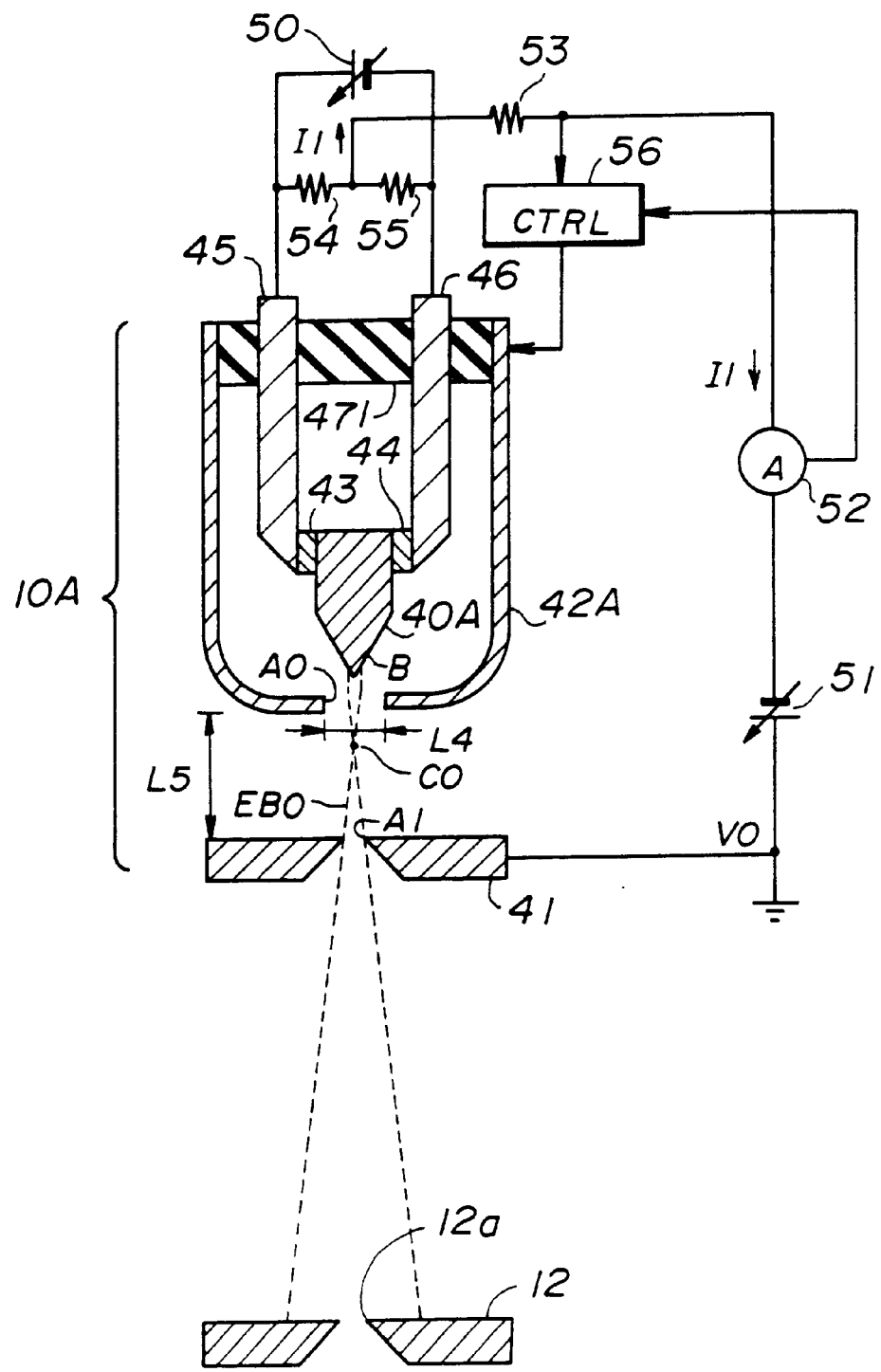
FIG. 3 is an illustrative drawing showing a configuration of an electron gun of FIG. 1 with a driving circuit thereof.
Figure 4A:
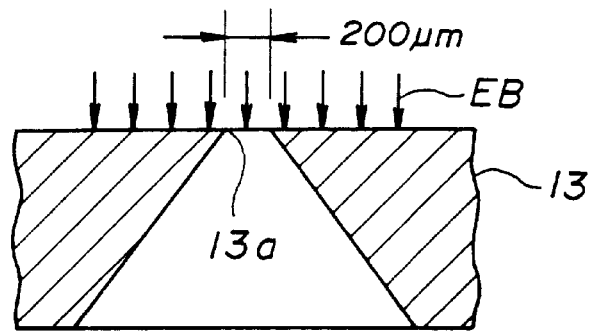
FIG. 4A is a cross-sectional view of the mask taken along a plane including an optical axis.
Figure 4B:
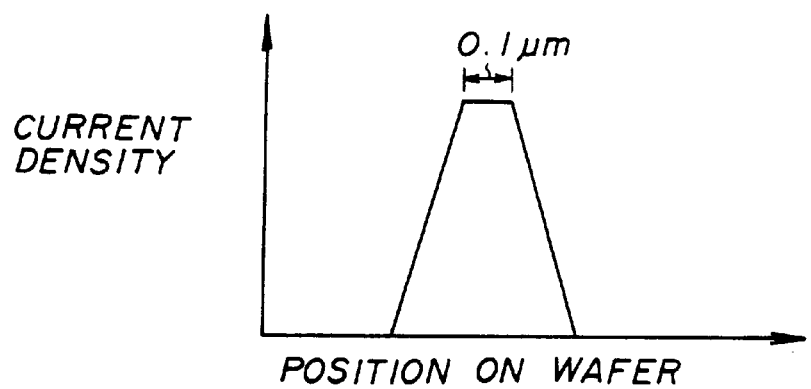
FIG. 4B is an illustrative drawing showing a current density distribution on a wafer of FIG. 1.
Figure 4C:
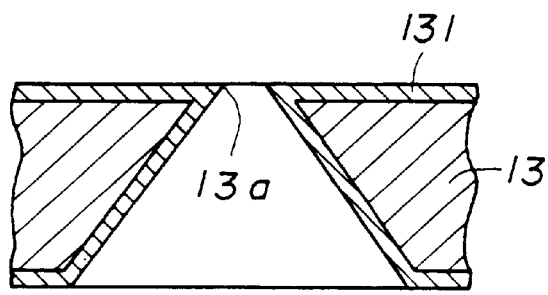
FIG. 4C is a cross-sectional view of an aperture formed by coating a Ta layer on the mask.
Figures 5A, 5B:
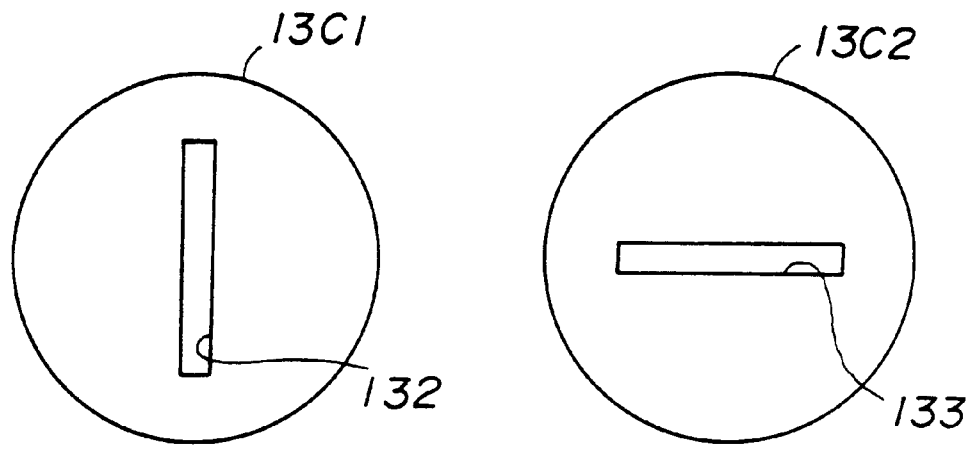
FIGS. 5A through 5C are illustrative drawings showing a method of creating a rectangular aperture without aperture rounding curvatures.
Figure 5C:
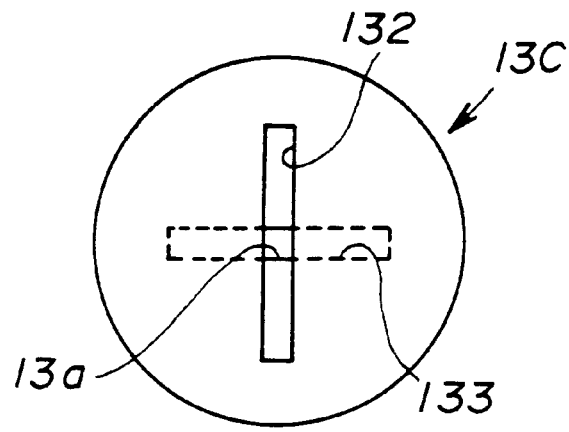

The control electrode 49 and the lens electrode 42 together play a role of the Wehnelt 42A of FIG. 3. The role of the Wehnelt 42A is now separately taken care of by the lens electrode 42 and the control electrode 49 in the electron gun 10 of FIG. 7, so that it is easier to adjust the electron beam. In the electron gun 10A of FIG. 3, a change in the voltage level of the Wehnelt 42A for the purpose of changing an emitted current brings about changes in the current density distribution, the position of the cross-over image CO, and the position of the electron-beam-emission boundary B. On the other hand, in the electron gun 10 of FIG. 7, even when the voltage level V2 of the control electrode 49 is changed to change the current of the electron beam EB2, neither the position of the cross-over image CO nor the shape of the electron beam passing through the aperture A3 changes. The position of the cross-over image CO is dependent on the voltage level V4 of the lens electrode 42. Therefore, the adjustment of the electron gun 10 is relatively easy.

Also, in the electron gun 10A of FIG. 3, the emission characteristics of the electron beam are sensitive to relative positions of the cathode 40A and the Wehnelt 42A and to the shape of the tip of the cathode 40A, which is subjected to a deformation caused by colliding positive ions. Thus, the assembly and maintenance of the electron gun 10A is not easy. In the electron gun 10 of FIG. 7, on the other hand, a tolerance range of the position of the cathode 40 for acceptable emission characteristics of the electron beam is relatively wide. Thus, the assembly of the electron gun 10 is easier. Also, even if positive ions colliding with the tip surface of the cathode 40 cause a deformation of the tip surface, the emission characteristics of the electron beam suffer little influence. Thus, the maintenance of the electron gun is easier, and the life of the electron gun 10 is elongated.

The heaters 43 and 44 are rectangular solids. The leads 45 and 46 are supported by the insulator 471 having a disc shape. The control electrode 49 and the guide electrode 48 are insulated from each other by an insulator 472, and the guide electrode 48 and the lens electrode 42 are insulated from each other by an insulator 473. In FIG. 7, the direct-current power sources 50 and 51, the ammeter 52, the bias resistors 53 through 55, and the control circuit 56 are the same as those of FIG. 3.

A current detected by the ammeter 52 is a difference (I1–I2) between the current I1 supplied to the cathode 40 and the current I2 supplied to the guide electrode 48. The control circuit 56 controls the voltage level V2 of the control electrode 49 such that the difference (I1–I2) becomes constant. In this manner, the current emitted from the electron gun 10 is kept constant without changing the position of the cross-over image and the shape and current density distribution of the electron beam.

Between an input of the control circuit 56 and the guide electrode 48, a direct-current power source 57 is provided. Also, a direct-current power source 58 is provided between a minus output of the direct-current power source 51 and the lens electrode 42. Output voltages of the direct-current power sources 50, 51, 57, and 58 are independently adjustable.

The first principle of the present invention has been described with reference to a particular embodiment. However, the first principle of the present invention is not limited to this embodiment, and various modifications and variations are intended to be within a scope of the first principle of the present invention.

In the above-described embodiment, the difference (I1–I2) is controlled to be constant. An alternate configuration may be such that the current I1 is detected and the control circuit 56 controls the voltage level V2 of the control electrode 49 so as to keep the current I1 constant. Furthermore, the tip surface of the cathode 40 may be generally flat only in an area corresponding to the aperture A3, and may be a curved surface in its entirety.

As described above, according to the first principle of the present invention, the guide electrode is provided to oppose the cathode having a tip surface, and has an aperture at the optical axis smaller than the tip surface of the cathode, so that the electron beam passing through the aperture has a relatively uniform distribution of the current density. The guide electrode is used for guiding electrons from the cathode. Since an acceleration of electrons up to the guide electrode is much smaller than that for the anode, the heat generation at the guide electrode is relatively small. A tolerance range of the position of the cathode for acceptable emission characteristics of the electron beam is relatively wider, so that the assembly of the electron gun is easier.

Also, even when positive ions colliding with the tip surface of the cathode deform the shape of the cathode tip, there is little influence on the emission characteristics of the electron beam. Thus, the maintenance of the electron gun is easier, and the life thereof will be elongated. Furthermore, a change in the voltage level of the control electrode for the purpose of changing a current of the electron beam does not bring about changes in the position of the cross-over image and the shape and current density distribution of the electron beam. Since the position of the cross-over image is determined by the voltage level of the lens electrode, the adjustment of the electron gun is easier.

In the following, a second principle and embodiments thereof will be described with reference to the accompanying drawings. The second principle of the present invention is intended to be used in the variable-rectangle method.

Figure 9A:
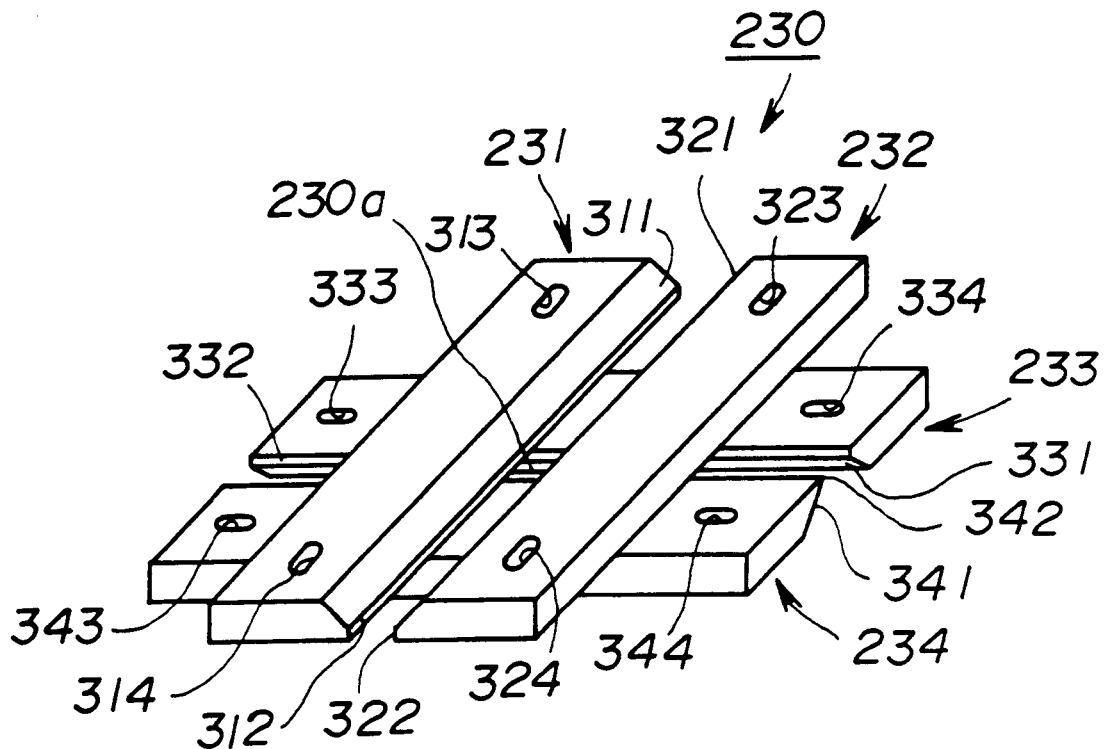
FIGS. 9A and 9B are illustrative drawings showing a mask according to a first embodiment of a second principle of the present invention.
Figure 9B:
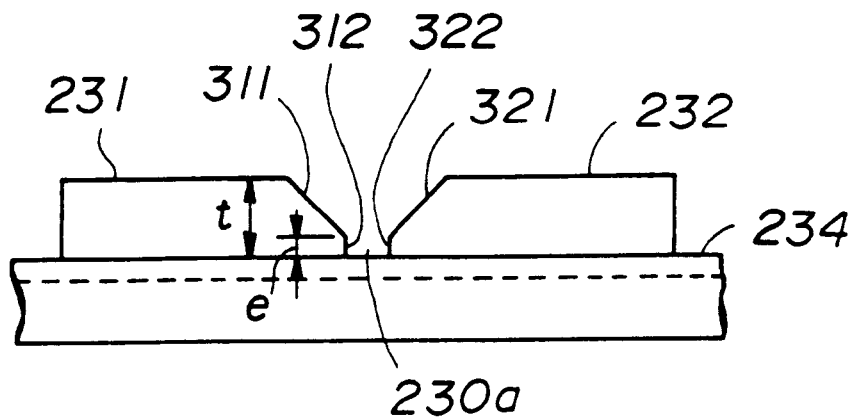

FIGS. 9A and 9B are illustrative drawings showing a mask 230 according to a first embodiment of a second principle of the present invention. FIG. 9A is an isometric view of the mask 230, and FIG. 9B is an enlarged partial front view of the mask 230.

In FIG. 9A, the mask 230 includes plates 231 through 234 which are identical to each other. The plates 231 through 234 are formed from a heavy metal having a high melting point and easily mechanically processed, e.g., Mo with a melting point of 2620° C. The plate 231 is a long rectangular plate, and one of the side surfaces thereof extending in a longitudinal direction is beveled by a mechanical process. Thus, a sloping surface 311 and a edge surface 312 are created by the beveling. A lapping process is applied to the edge surface 312 to obtain a smooth surface with surface irregularity under about 1 Am.

At both ends of the plate 231, elongated holes 313 and 314 are formed to receive a fixing bolt. A longitudinal direction of the elongated holes 313 and 314 is the same as the longitudinal direction of the plate 231. The elongated holes 313 and 314 are used for fixedly mounting the plate 231 to a holder by adjusting the position of the plate 231 in the longitudinal direction such that the surface irregularity of the edge surface 312 at a point of an aperture 230a becomes smaller than a predetermined limit.

In the same manner, the plate 232 is provided with a sloping surface 321, an edge surface 322, and elongated holes 323 and 324. The plate 233 is provided with a sloping surface 331, an edge surface 332, and elongated holes 333 and 334. The plate 234 is provided with a sloping surface 341, an edge surface 342, and elongated holes 343 and 344.

The widest surfaces of the plates 231 and 232 are in surface contact with the widest surfaces of the plates 233 and 234, as shown in FIG. 9A. The edge surface 312 and the edge surface 322 face each other, and the edge surface 332 and the edge surface 342 face each other. The plates 231 and 232 are arranged perpendicular to the plates 233 and 234. The edge surfaces 312, 322, 332, and 342 together form the aperture 230a.

Figure 10C:
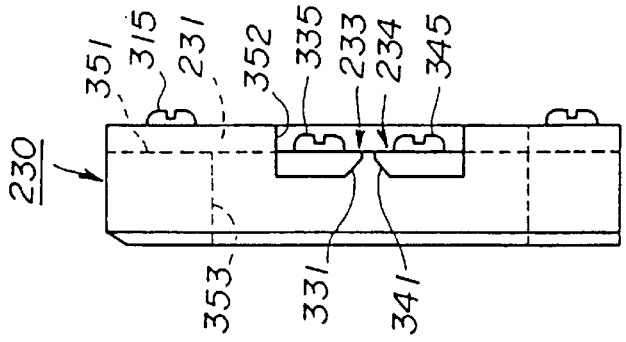
FIGS. 10A through 10C are illustrative drawings showing the mask with plates thereof attached to a holder.
Figure 10A:
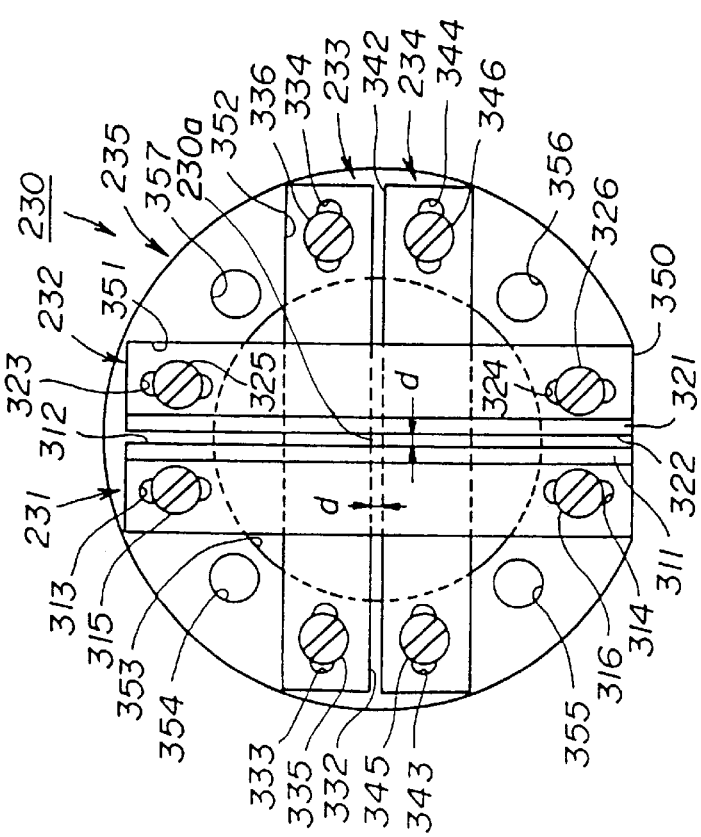
Figure 10B:
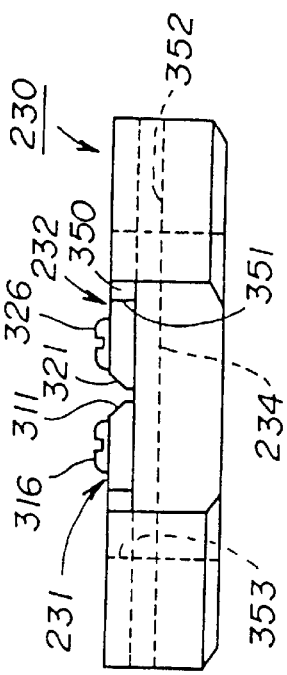

FIGS. 10A through 10C are illustrative drawings showing the mask 230 with the plates 231 through 234 attached to a holder 235. As shown in FIG. 10A, the holder 235 has a ring shape.

Preferably, the holder 235 is formed from the same material as that of the plates 231 through 234, so that stress is not generated by a thermal expansion difference. Part of the perimeter of the holder 235 is vertically cut off to create a reference surface 350. Also, the holder 235 has a circular hole 353 at a center thereof. By using the reference surface 350, the holder 235 is held in a chuck. A groove 351 for receiving the plates 231 and 232 is formed in the holder 235 by using a lathe to extend across the circular hole 353 in a direction perpendicular to the reference surface 350. Also, a groove 352 for receiving the plates 233 and 234 is formed in the holder 235 in a direction perpendicular to the groove 351. A depth of the groove 351 is the same as the thickness of the plate 231, and a depth of the groove 352 is twice as deep as that of the groove 351. The plates 233 and 234 are fitted into the groove 352, and, then, the plates 231 and 232 are fitted into the groove 351 to arrange these plates in a configuration shown in FIG. 9A.

Before fixing the plates 231 through 234 to the holder 235 with bolts, a dimension D of the surface irregularity of the edge surfaces 312, 322, 332, and 342 is measured by a measuring device. Positions of the plates 231 through 234 in respective longitudinal directions thereof are determined such that the aperture 230a is formed by surfaces having the dimension D of the surface irregularity smaller than a predetermined value. Then, the plates 231 through 234 are fixed to the holder 235 with bolts. That is, bolts 335 and 336 are inserted into the elongated holes 333 and 334, and the plate 233 is positioned such that a side surface of the plate 233 extending in the longitudinal direction is in surface contact with a side surface of the groove 352. Then, the bolts 335 and 336 are screwed into holes (not shown) formed in the groove 352 to fix the plate 233 to the holder 235. In the same manner, the plate 234, the plate 231, and the plate 232 are fixed to the holder 235 with bolts 345 and 346, bolts 315 and 316, and bolts 325 and 326, respectively.

Even when the dimension D of the surface irregularity exceeds the predetermined limit after repeated use over time, the plates 231 through 234 can be readjusted in the respective longitudinal directions. Thus, the aperture 230a can be again formed by surfaces having the surface irregularity under the predetermined value. Thus, the mask 230 has an elongated (i.e., extended) life.

Also, the holder 235 is provided with round holes 354 through 357. Bolts are inserted through the round holes 354 through 357 to fixedly mount the mask 230 to the charged-particle-beam exposure device.

In FIG. 9B, a thickness t of the plate 231 is sufficient if the plate 231 is sturdy enough to be processed and mounted. When Mo is used, the thickness t should be greater than 500 µm. An angle of the sloping surface 311 should be such that the sloping surface 311 does not functionally become part of the aperture 230a. Preferably, the angle is 45° which is easy to process in the beveling. A width e of the edge surface 312 in a direction of the optical axis is preferably within a range between 10 µm and 100 µm, as will be described later. For example, the width e may be 15 µm. The width e should be greater than a range which electrons of the electron beam travel on average through the material before being stopped by collisions. If the width e is smaller than this range, the electron beam penetrates through the edges of the aperture 230a to deteriorate sharpness of an exposed pattern. A minimum width of the width e varies depending on the material used for the plates 231 through 234. The minimum width of the width e is the largest of the lower limit of the mechanical process (e.g., 10 µm for Mo) and the range of electrons (e.g., 3.9 µm for Mo with a 50 KV electron beam). Typically, the minimum width of the width e is determined by the former.

The dimension D of the surface irregularity of the edge surface 312 and the upper limit of the width e of the edge surface 312 are determined as follows.

Figure 1:
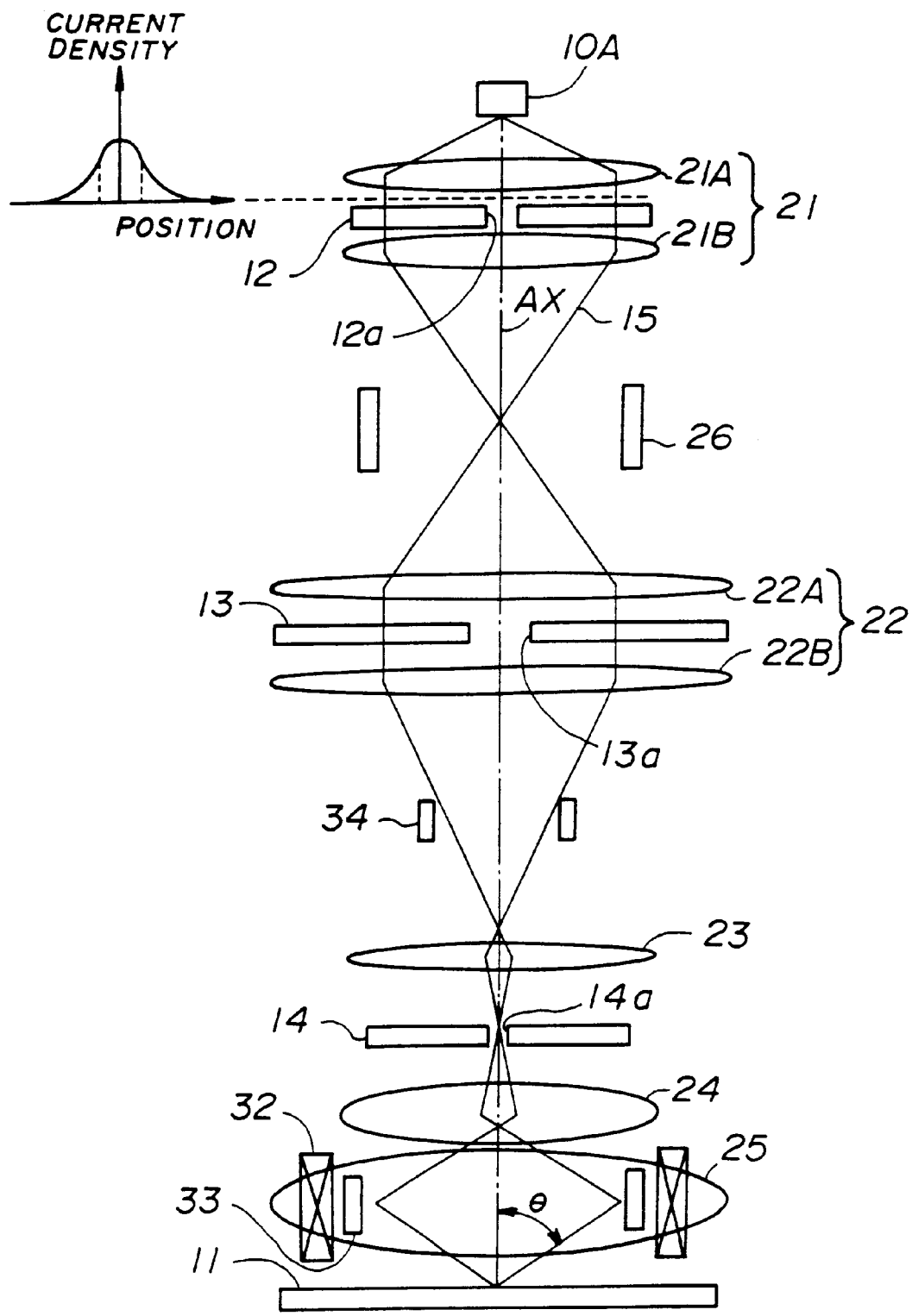
FIG. 1 is an illustrative drawing showing a schematic configuration of a charged-particle-beam exposure device of the prior art.
Figure 2:
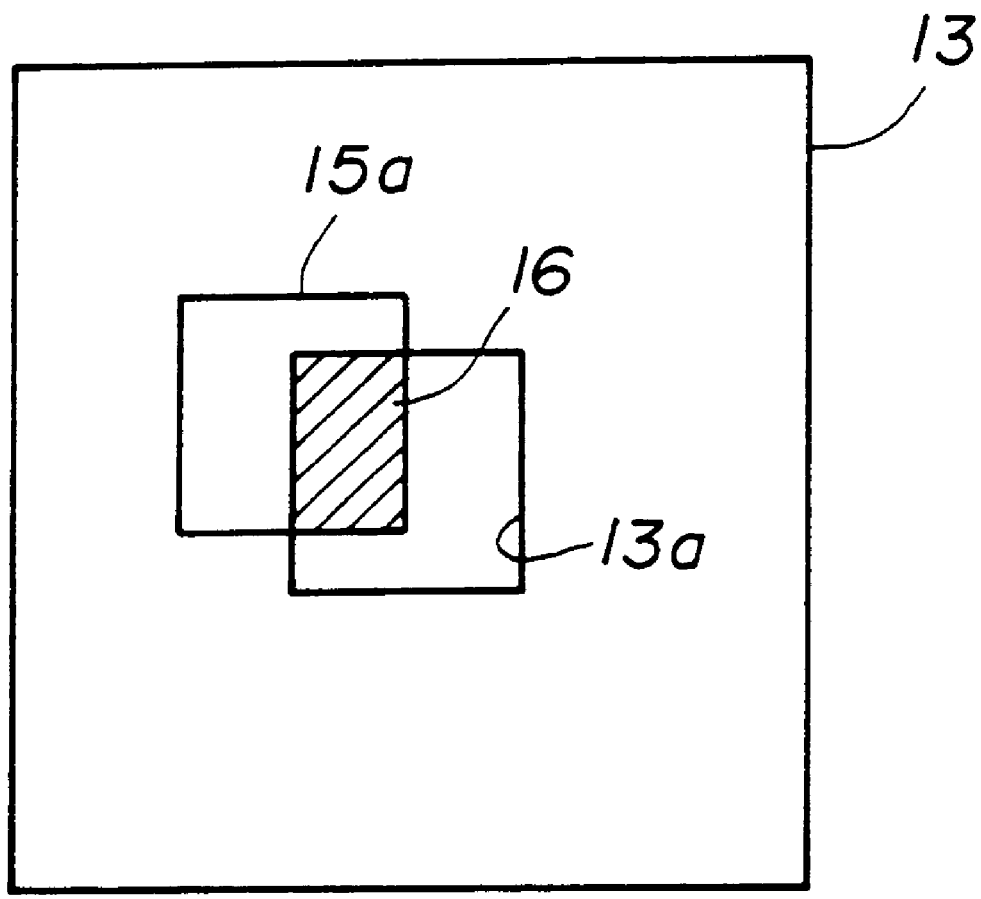
FIG. 2 is an illustrative drawing showing a displaced charged-particle beam on a mask of FIG. 1.

In FIG. 1, assume that a convergence angle e of the electron beam incident onto the wafer 11 is 5 mrad, a projection reduction ratio (reduction ratio of length) M from the aperture 13a to the wafer 11 is 100, and a tolerable error a of a pattern width on the wafer 11 is 0.01 µm.

In this case, the dimension D of the surface irregularity of the edge surface 312 corresponds to D/M on the wafer 11. Thus, D/M should be smaller than or equal to α.

$$D \leq \alpha \cdot M = 0.01 \times 100 = 1 \ [\mu m] \quad (1)$$

This condition is achievable by applying a lapping process when Mo is used. An edge width 2 e of the aperture 230a in a direction of the optical axis corresponds to 2 e/M in the direction of the optical axis on the wafer 11, so that the electron beam spreads by (2e/M)·tan θ in a direction perpendicular to the optical axis. Thus, (2 e/M)·tan θ should be smaller than or equal to α.

$$e \leq \alpha M/(2 \tan \theta) = 0.01 \times 100/(2 \times 0.005) = 100 \ \mu m \quad (2)$$

This is greater than the lower limit (10 µm) of the mechanical process, so that there is no problem in creating the aperture 230a satisfying this condition.

The holder 235 has a thickness of 5 mm, an outer diameter of 24 mm, an inter diameter of 14 mm, a width of the grooves 351 and 352 of 8.2±0.001 mm, a depth of the groove 351 of 1 mm, and a depth of the groove 352 of 2 mm, for example. The plate 231 has a length of 22 mm, a width of 4 mm, a thickness of 1 mm, a slope angle of the sloping surface 311 of 45°, and an edge width e of 15 µm, for example.

FIGS. 11A through 11C are illustrative drawings showing a mask 230A according to a second embodiment of the second principle of the present invention.

In the configuration of FIGS. 10A through 10C of the first embodiment, the holder 235 is formed from the same material (e.g., Mo) as that of the plates 231 through 234. Since there is a difference in temperature between a central portion of the plates 231 through 234 and the holder 235, however, a stress caused by thermal expansion is relatively large. Thus, even though the plates 231 through 234 are fixed to the holder 235 with the bolts, the plates 231 through 234 may suffer displacements of position after repeated use of the mask 230.

In the second embodiment of the second principle of the present invention, pins 361 through 368 are used for fixing the plates 231 through 234 as shown in FIGS. 11A through 11C. First, the plates 231 through 234 are fixed to the holder 235 with the bolts after the positions thereof are determined. Then, holes are formed through both the plates 231 through 234 and the holder 235. Then, the pins 361 through 368 having a diameter slightly larger than that of the holes are inserted into the holes to prevent the displacements of the plates 231 through 234. Preferably, the pins 361 through 368 are formed from the same material as that of the plates 231 through 234 such as Mo.

The second principle of the present invention has been described with reference to particular embodiments. However, the second principle of the present invention is not limited to these embodiments, and various modifications and variations are intended to be within a scope of the second principle of the present invention.

For example, the mask 230 can be used as the diaphragm 12 of FIG. 1. With a reduction rate K of an image from the rectangular aperture 12a to the mask 13, the upper limits of the dimension D of the surface irregularity and the edge width e are K times as large as those figures described above. For example, K is 2.5. When the mask 230 is used in the place of the diaphragm 12 in FIG. 1, the charged-particle-beam exposure device may have a configuration using a block mask or a blanking-aperture array.

As described above, according to the second principle of the present invention, the plates for forming the aperture are formed from a heavy metal having a high melting point and easily mechanically processed. Thus, the mask is easily manufactured, and a high-energy electron beam can be used. Also, use of an appropriate edge width e makes it possible to provide a sufficient sharpness for an exposed pattern.

Also, according to the second principle of the present invention, the positions of the plates in the longitudinal directions are adjusted such that the aperture is formed by edge surfaces having a sufficient smoothness. Because a desired condition is satisfied by this adjustment, the yield of the mask is improved. Also, even if the edge surfaces are timeworn and no longer have a required smoothness, readjustment of the positions of the plates can regain the required condition, thereby elongating the life of the mask.

Also, according to the second principle of the present invention, the edge width e is greater than the range of the charged particles, so that the charged-particle beam does not penetrate through the edges of the aperture to deteriorate the sharpness of the exposed pattern. Also, the edge width 2 e of the aperture can be sufficiently short, so that the exposed pattern satisfies a desired sharpness.

In the following, a third principle and embodiments thereof will be described with reference to the accompanying drawings.

Figure 6:
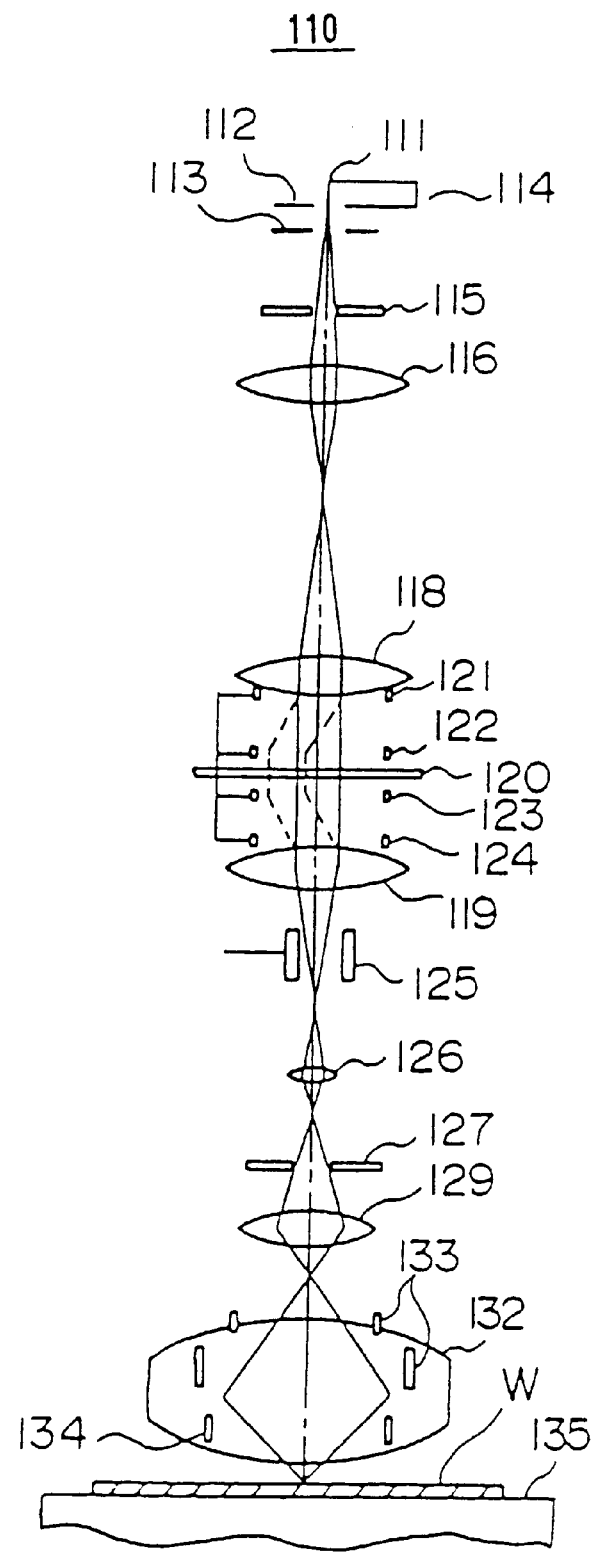
FIG. 6 is an illustrative drawing showing an exposure-column unit of a charged-particle-beam exposure device of a block exposure type of the prior art.
Figure 12:
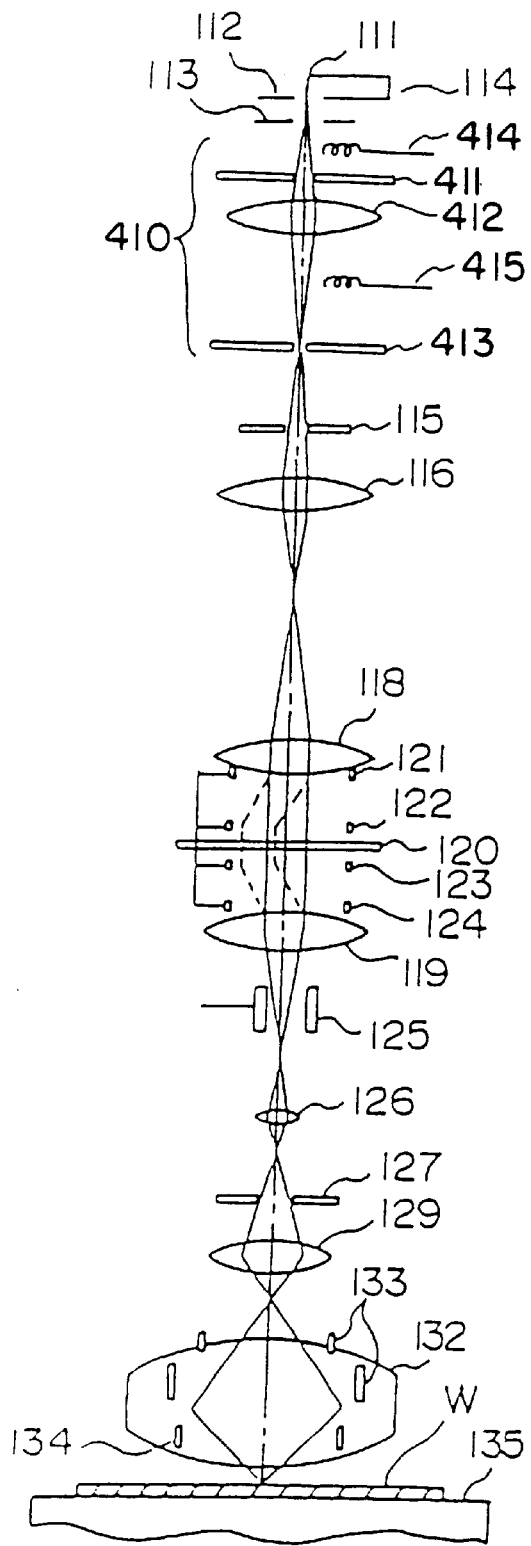
FIG. 12 is an illustrative drawing showing an optical system of a charged-particle-beam exposure device according to a first embodiment of the third principle of the present invention.

FIG. 12 is an illustrative drawing showing an optical system 410 of a charged-particle-beam exposure device according to a first embodiment of the third principle of the present invention. In FIG. 12, the same elements as those of FIG. 6 are referred to by the same numerals, and a description thereof will be omitted.

The optical system 410 of the third principle is located further upstream than the first slit 115, which is located the most upstream in the prior-art optical system. The optical system 410 at this position forms a cross-over image and partially cuts off the cross-over image to remove an excessive portion of the electron beam. As shown in FIG. 12, the optical system 410 of the present invention includes a beam-cutting-off aperture 411 formed from metal such as Mo, a cross-over-image forming lens 412, a round shaping aperture 413 formed from metal such as Mo, a first alignment coil 414, and a second alignment coil 415.

An electron beam emitted from the electron-beam generator 114 is partially cut off by the beam-cutting-off aperture 411 to reduce the current amount thereof. The cross-over-image forming lens 412 forms a cross-over image at a position of the round shaping aperture 413. The round shaping aperture 413 partially cuts off the cross-over image.

Figure 13:
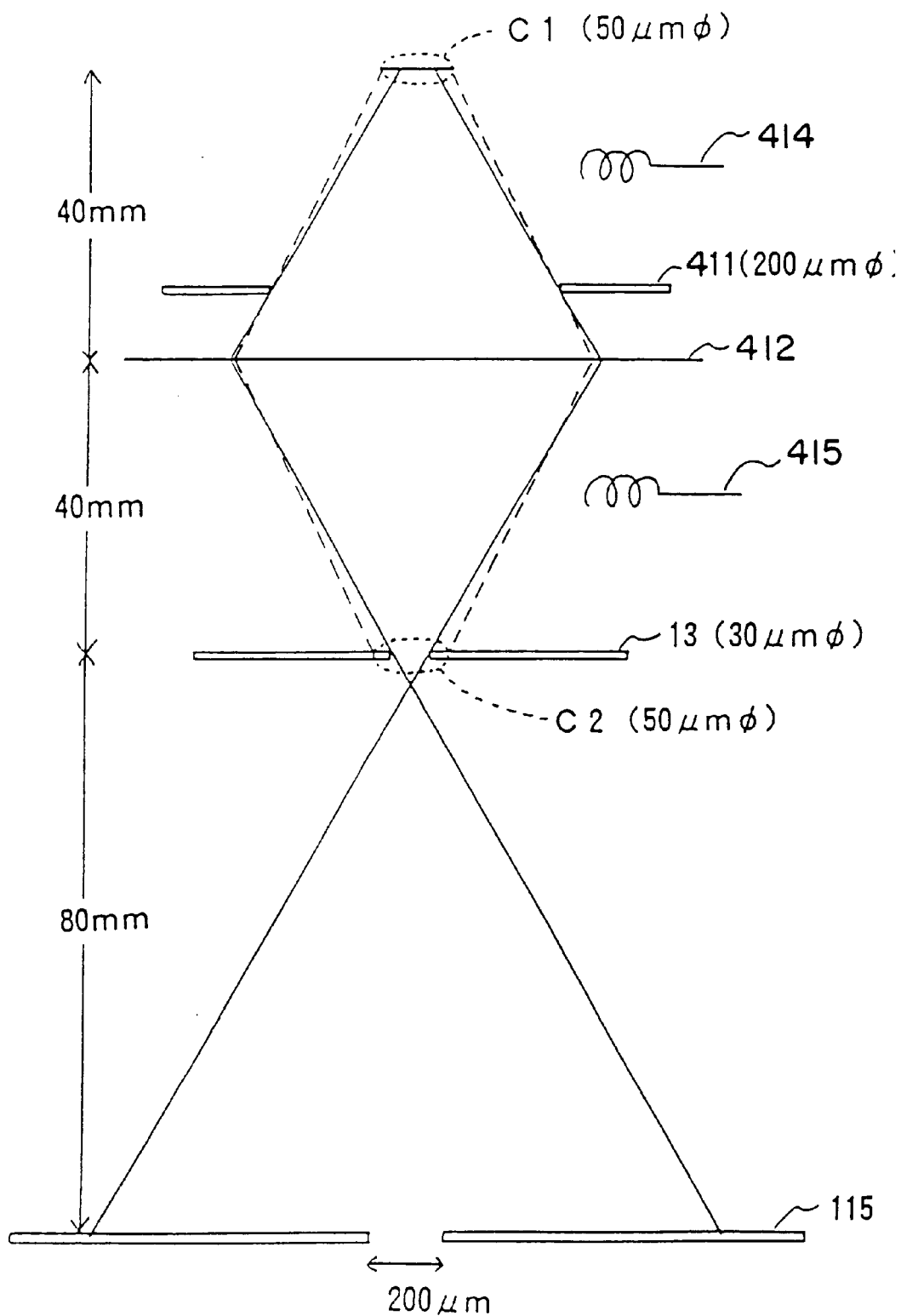
FIG. 13 is an illustrative drawing showing an enlarged view of the optical system of FIG. 12.

FIG. 13 is an illustrative drawing showing an enlarged view of the optical system 410. Dimensions of elements shown in FIG. 13 are examples of numbers which may be used in the charged-particle-beam exposure device in the field. In FIG. 13, a first cross-over image C1 with a 50-$\mu$m diameter is formed immediately under the electron gun. The cross-over-image forming lens 412 forms a second cross-over image C2 having a 50-$\mu$m diameter at a position of the round shaping aperture 413. The round shaping aperture 413 has a round aperture of a 30-$\mu$m diameter, and cuts off a peripheral part of the second cross-over image C2 to shape a cross section of the electron beam. The electron beam having the shaped cross section and a reduced current amount is directed to the first slit 115.

The round shaping aperture 413 is located at a position where the second cross-over image C2 is formed, i.e., at a position where the electron beam is focused to give the greatest energy concentration. At this focus point, even such metal as molybdenum or tungsten is at risk of being melted by heat due to the energy of the electron beam. The round shaping aperture 413 needs to be a thin plate such as one having a thickness of 100 $\mu$m since a small aperture about a size of 30 $\mu$m needs to be formed. Thus, it is likely that the round shaping aperture 413 is melted by the heat due to the energy of the electron beam. In order to avoid this, the beam-cutting-off aperture 411 positioned out of the focus point partially cuts off the electron beam emitted from the electron gun. Thus, the current amount of the electron beam is reduced before the electron beam reaches the round shaping aperture 413.

Passing through the beam-cutting-off aperture 411 and the round shaping aperture 413, the electron beam has a current amount reduced from about 500 $\mu$A to about 30 $\mu$A.

Accordingly, the melting of the mask 120 (for forming a pattern to be exposed) is avoided, and the accumulation and charging up of contamination are reduced.

The size of the round shaping aperture 413 is determined based on the size of the round aperture 127 (see FIG. 12) located further downstream in the flow of the electron beam. That is, the round shaping aperture 413 is formed such that the cross-sectional size of the electron beam coincides with the diameter of the round aperture 127 when the electron beam having cross-sectional size and shape determined by the round shaping aperture 413 reaches the round aperture 127.

Accordingly, the deflection amount which is required for completely cutting off the electron beam by the round aperture 127 during a blanking operation can be sustained at a minimum. Thus, it is possible to use a lower voltage level for the blanking operation to achieve a high-speed blanking operation.

In FIG. 13, the beam-cutting-off aperture 411 is a round aperture with a 200-$\mu$m diameter. As described above, the beam-cutting-off aperture 411 serves to reduce the current amount of the electron beam by partially cutting of the electron beam emitted from the electron-beam generator 114, so that the round shaping aperture 413 located at the focus point does not melt. Also, the beam-cutting-off aperture 411 serves to define an incident angle and an output angle of the electron beam with respect to the round shaping aperture 413.

Figure 14:
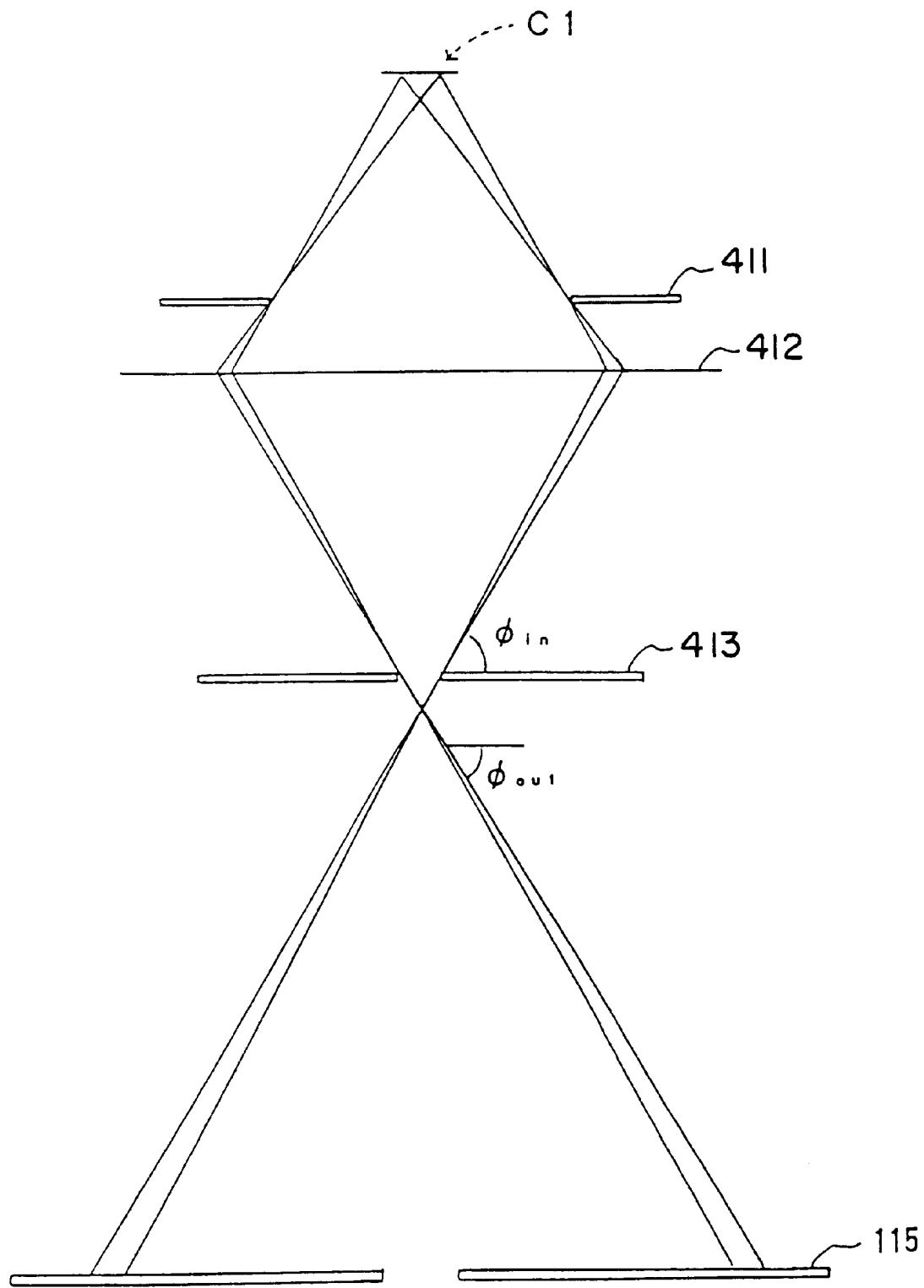
FIG. 14 is an illustrative drawing showing a shape of an electron beam when a beam-cutting-off aperture of FIG. 13 is a large aperture.
Figure 15:
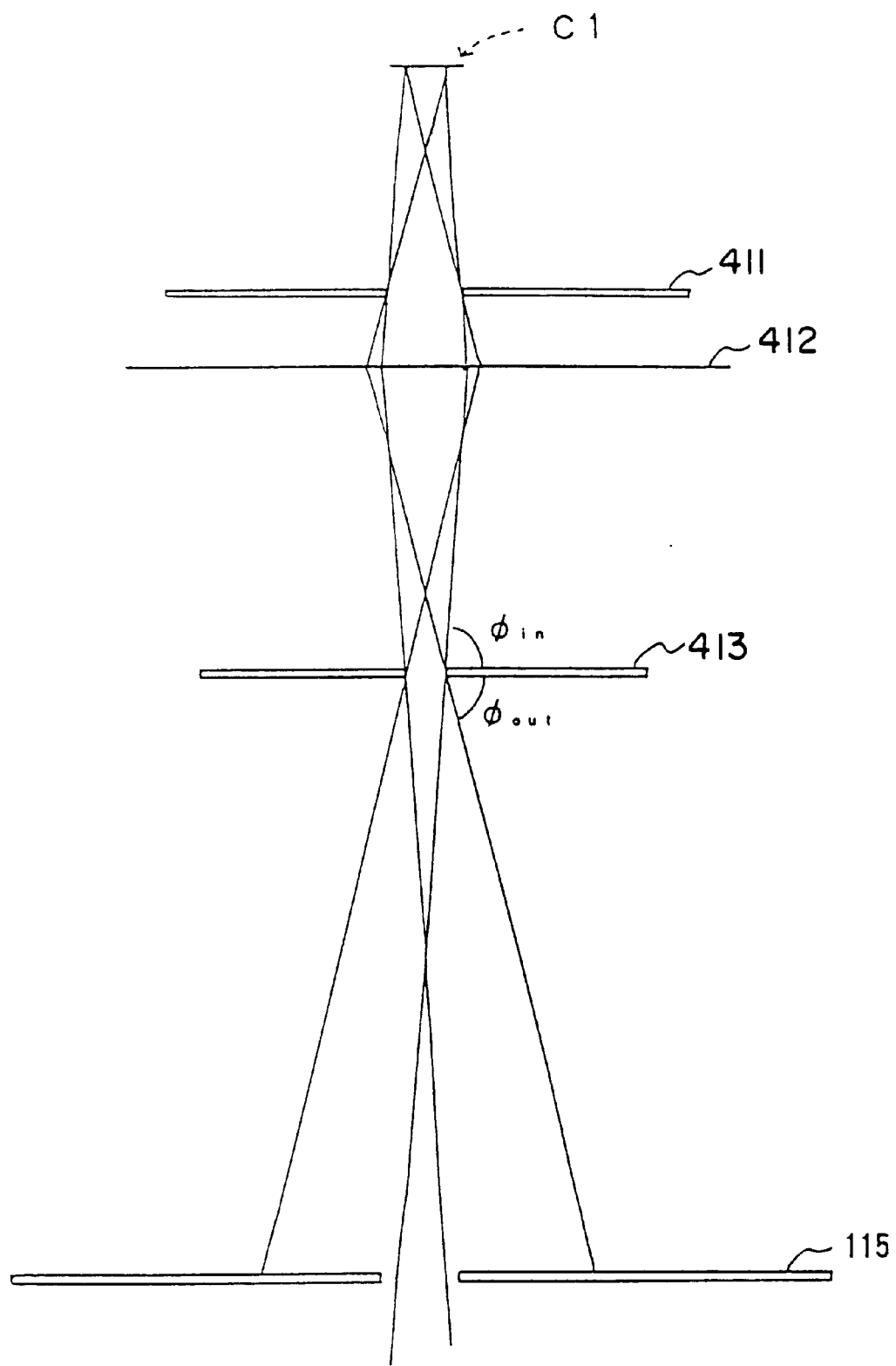
FIG. 15 is an illustrative drawing showing a shape of the electron beam when the beam-cutting-off aperture is a small aperture.

FIG. 14 is an illustrative drawing showing a shape of the electron beam when the beam-cutting-off aperture 411 is a large aperture. FIG. 15 is an illustrative drawing showing a shape of the electron beam when the beam-cutting-off aperture 411 is a small aperture.

As shown in FIG. 14, when the beam-cutting-off aperture 411 is a large aperture, an incident angle $\phi_{in}$ and an output angle $\phi_{out}$ of the electron beam with respect to the round shaping aperture 413 are small. In this case, the electron beam covers a sufficiently wide area on the first slit 115, so that the electron beam passing through the first slit 115 is complete. Thus, the mask 120 located further downstream is covered by a sufficiently uniform distribution of the electron beam.

On the other hand, as shown in FIG. 15, when the beam-cutting-off aperture 411 is a small aperture, an incident angle $\phi_{in}$ and an output angle $\phi_{out}$ of the electron beam with respect to the round shaping aperture 413 are large. In this case, the electron beam does not cover a sufficiently wide area on the first slit 115, so that the electron beam passing through the first slit 115 is incomplete. Thus, the mask 120 located further downstream is not covered by a sufficiently uniform distribution of the electron beam. Also, there is a risk that an image of the beam-cutting-off aperture 411 and an image of the first slit 115 are mistaken with each other.

Accordingly, the beam-cutting-off aperture 411 must satisfy conditions that the electron beam passing through the first slit 115 is complete and the mask 120 located further downstream is covered by a sufficiently uniform distribution of the electron beam.

With reference back to FIGS. 12 and 13, the first alignment coil 414 and the second alignment coil 415 are provided to align the electron beam, so that the electron beam passes through the beam-cutting-off aperture 411 and the round shaping aperture 413. Namely, the first alignment coil 414 is used for adjusting the trajectory of the electron beam to pass it through the beam-cutting-off aperture 411. Then, the second alignment coil 415 is used for adjusting the trajectory of the electron beam to pass it through the round shaping aperture 413. In this manner, the first alignment coil 414 and the second alignment coil 415 arranged above and below the beam-cutting-off aperture 411, respectively, can carry out an alignment of the electron beam with respect to the beam-cutting-off aperture 411 and the round shaping aperture 413.

As described above, according to the first embodiment of the third principle of the present invention, the electron beam emitted from the electron-beam generator 114 is partially cut off by the beam-cutting-off aperture 411 to reduce the current amount, and, then, the round shaping aperture 413 located at the position of the cross-over image partially cuts off the cross-over image to shape the cross section of the electron beam. Therefore, a part of the current which becomes excessive after going downstream in the flow of the electron beam is cut off, so that the mask 120 is prevented from melting through heat. Also, the accumulation and charging up of the contamination can be reduced. Furthermore, when the size of the round shaping aperture 413 matches with the size of the round aperture 127, the deflection amount of the electron beam required during the blanking operation is sustained at a minimum. Therefore, a high-speed blanking operation is achieved.

Also, in the first embodiment of the third principle of the present invention, a reduction in the current amount of the electron beam helps to reduce the influence of Coulomb interactions, in which the electron beam is blurred at the focus point due to the mutual repulsion of electrons. When there is a strong presence of the Coulomb interactions, electrons having negative charge are repulsed by each other to expand the electron beam at the focus point. The magnitude of the Coulomb interactions is proportional to a product of the current density of the electron beam and the cross-sectional area of the electron beam, i.e., is proportional to the total current amount of the electron beam. Thus, the reduction in the current amount according to the first embodiment of the third principle can lessen the influence of the Coulomb interactions.

Figure 16:
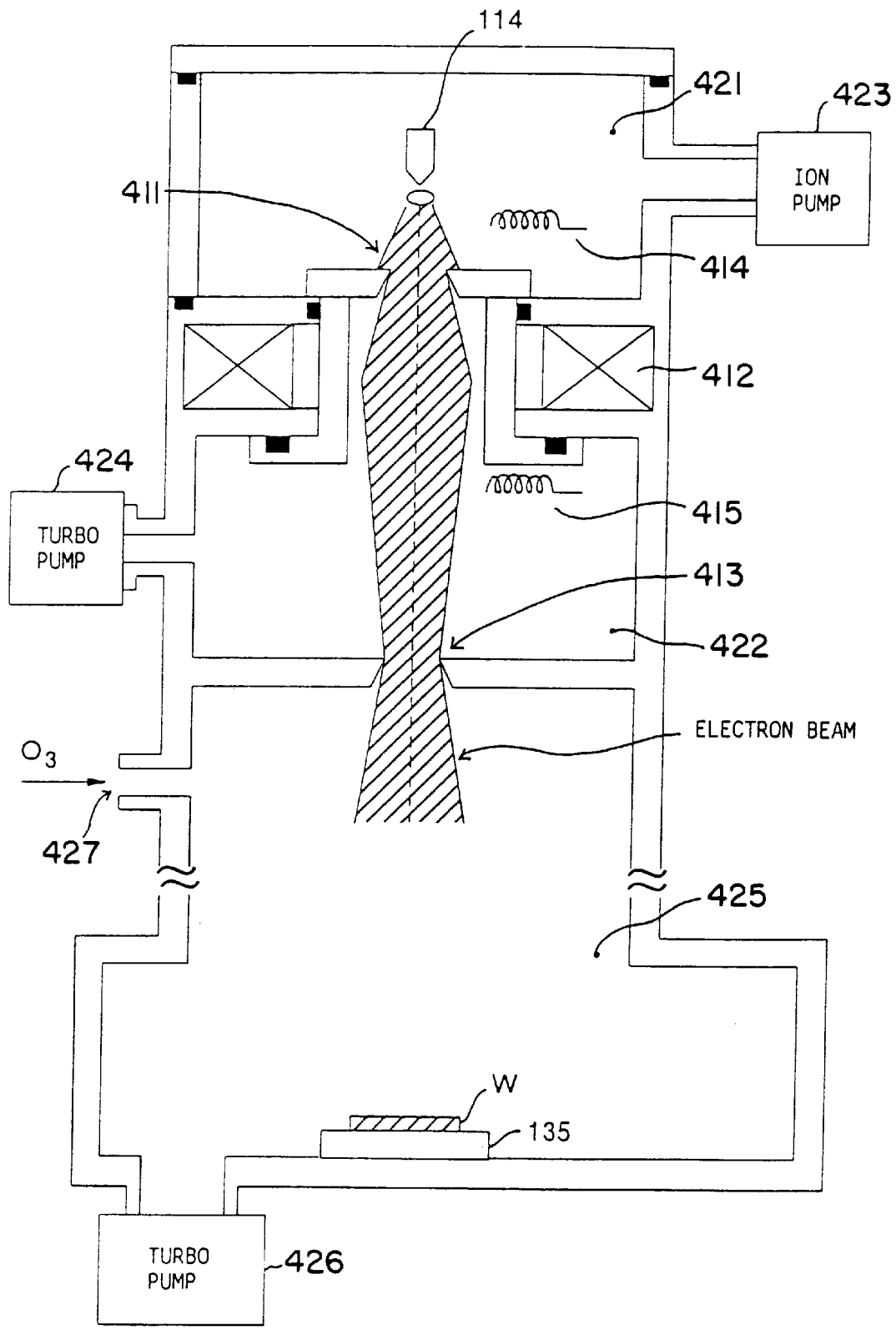
FIG. 16 is an illustrative drawing showing a configuration of a charged-particle-beam exposure device according to a second embodiment of the third principle of the present invention.

FIG. 16 is an illustrative drawing showing a configuration of a charged-particle-beam exposure device according to a second embodiment of the third principle of the present invention.

In general, ozone $O_3$ is injected inside an exposure column of the charged-particle-beam exposure device. Since it is difficult to produce pure ozone alone, various gases in addition to ozone are mixed in the exposure column. When these gases are ionized to be positively charged, ions hit the electron-beam generator 114 at high speed. These collisions of the ions with the electron-beam generator 114 cause deformation of the electron emitting surface of the electron-beam generator 114. When a shape of the electron beam is distorted by this deformation, an exposure pattern cannot be created properly on a wafer. Therefore, it is desirable to keep the electron-beam generator 114 in a high-degree-vacuum condition.

In the second embodiment of the third principle of the present invention, the beam-cutting-off aperture 411 and round shaping aperture 413 of FIG. 12 are used for enhancing the degree of vacuum around the electron-beam generator 114.

In FIG. 16, the charged-particle-beam exposure device briefly includes a first chamber 421, a second chamber 422, and a third chamber 425. The first chamber 421 contains the electron-beam generator 114 and the first alignment coil 414. The second chamber 422 contains the cross-over-image forming lens 412 and the second alignment coil 415. The third chamber 425 is a space in which the wafer W on the stage 135 is exposed to the electron beam in the same manner as in the prior-art charged-particle-beam exposure device.

The charged-particle-beam exposure device of FIG. 16 further includes an ion pump 423 for pumping ions out of the first chamber 421, a turbo pump 424 for pumping gases out of the second chamber 422, and a turbo pump 426 for pumping gases out of the third chamber 425. While air is taken out of the third chamber 425 by the turbo pump 426 to create a vacuum condition therein, ozone is injected through an ozone-injection opening 427.

Space inside the first chamber 421 is connected via the beam-cutting-off aperture 411 with space inside the second chamber 422. Also, the space inside the second chamber 422 and space inside the third chamber 425 are connected via the round shaping aperture 413.

Since the round shaping aperture 413 between the second chamber 422 and the third chamber 425 is a small aperture having a diameter of 30 $\mu$m, the turbo pump 424 can make the degree of vacuum inside the second chamber 422 greater than that of the third chamber 425. The ion pump 423 takes out ions which are harmful to the electron-beam generator 114, and, also, keeps the inside of the first chamber 421 at a higher degree of vacuum than the inside of the second chamber 422.

As described above, according to the second embodiment of the third principle of the present invention, the beam-cutting-off aperture 411 and the round shaping aperture 413 are used along with the ion pump 423 and the turbo pump 424 to keep different pressures inside different chambers, so that the space around the electron-beam generator 114 is kept under the high-degree-vacuum condition. Therefore, the electron-beam generator 114 free from the damage caused by ion collisions generates a distortion-free electron beam.

Figure 17:
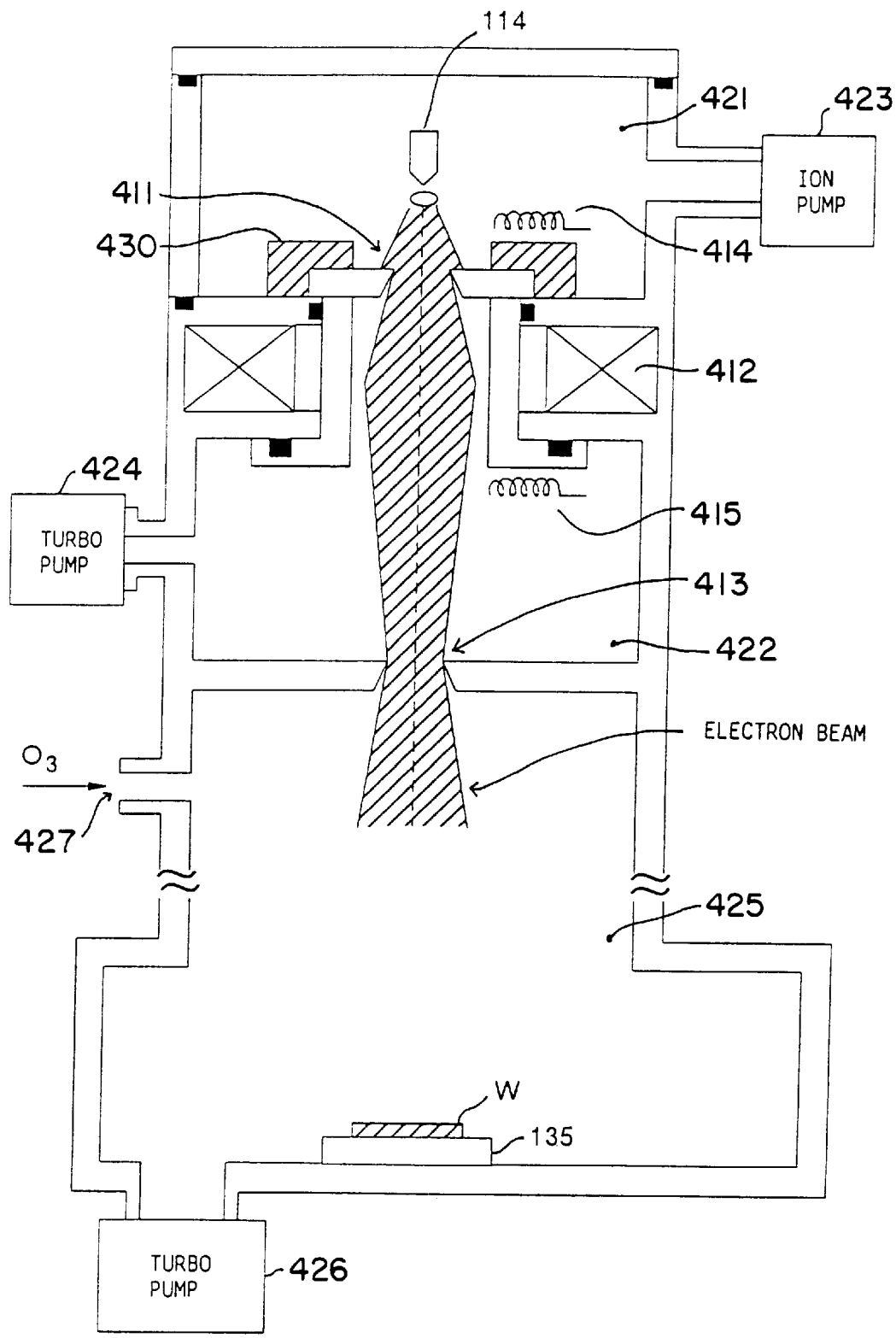
FIG. 17 is an illustrative drawing showing a configuration of a charged-particle-beam exposure device according to a third embodiment of the third principle of the present invention.

FIG. 17 is an illustrative drawing showing a configuration of a charged-particle-beam exposure device according to a third embodiment of the third principle of the present invention. In FIG. 17, the same elements as those of FIG. 16 are referred to by the same numerals, and a description thereof will be omitted. The charged-particle-beam exposure device of FIG. 17 differs from the charged-particle-beam exposure device of FIG. 16 of the second embodiment only in that a cooling mechanism 430 is provided for the beam-cutting-off aperture 411.

The cooling mechanism 430 is preferably that of water cooling. Use of the cooling mechanism 430 prevents a temperature rise of the beam-cutting-off aperture 411 and neighboring elements thereof. In this manner, a temperature rise of the exposure column of the charged-particle-beam exposure device can be alleviated, so that changes in operation characteristics of the device are sustained at a minimum level.

As described above, according to the third principle of the present invention, the round shaping aperture cuts off a peripheral portion of the cross-over image to shape the cross section of the electron beam, and the beam-cutting-off aperture located further upstream reduces the current amount of the electron beam so as to prevent a plate of the round shaping aperture from melting through heat generation. Therefore, when the electron beam passing through the round shaping aperture is directed to the mask, there is no risk that the mask is melted by heat generation. Also, since an excessive portion of the electron beam is cut off by the round shaping aperture, the likelihood of the accumulation and charging up of the contamination is reduced.

Also, according to the third principle of the present invention, the size of the round shaping aperture is such that when the electron beam shaped by the round shaping aperture reaches the round aperture for the blanking operation, the cross-sectional size of the electron beam is about the same as the size of the round aperture. Therefore, when the blanking operation is conducted by deflecting the electron beam to cut off the electron beam with the round aperture, the high-speed blanking operation is achieved.

Also, according to the third principle of the present invention, the size of the beam-cutting-off aperture is such that an aperture of the mask is covered by a uniform distribution of the electron beam passing through the round shaping aperture. Thus, even through the beam-cutting-off aperture partially cuts off the electron beam at a position out of the focus point, there is no adverse effect on the exposure process for the wafer.

Also, according to the third principle of the present invention, the plate of the round shaping aperture and the plate of the beam-cutting-off aperture are formed from Mo. Thus, these plates are not melted by heat generation.

Also, according to the third principle of the present invention, the first alignment coil (deflector) and the second alignment coil (deflector) are provided for making the electron beam pass through the beam-cutting-off aperture and the round shaping aperture. Thus, the adjustment of the first and second alignment coils enables an easy alignment of the electron beam with respect to the beam-cutting-off aperture and the round shaping aperture.

Also, according to the third principle of the present invention, the cooling mechanism is provided for cooling the plate of the beam-cutting-off aperture, so that a temperature rise of the plate and the surrounding elements thereof are prevented. Therefore a temperature rise of the exposure column of the charged-particle-beam exposure device can be alleviated, so that changes in operation characteristics of the device are sustained at a minimum level.

Also, according to the third principle of present invention, the second chamber defined by the plate of the round shaping aperture and the plate of the beam-cutting-off aperture is placed between the third chamber for exposing a wafer to the electron beam and the first chamber containing the electron-beam generator, where the first chamber and the first chamber are connected with each other via these two apertures. Therefore, the inside of the first chamber containing the electron-beam generator can be maintained in a higher degree of vacuum than the inside of the third chamber.

Also, according to the third principle of the present invention, the degree of vacuum in the second chamber is greater than that in the third chamber. Thus, a high degree of vacuum in the first chamber is easily achieved.

Also, according to the third principle of the present invention, ozone is injected into the third chamber. Because of the configuration of the first through the third chamber described above, the injection of ozone into the third chamber does not affect the electron-beam generator in the first chamber.

Further, the present invention is not limited to these embodiments, but various variations and modifications may be made without departing from the scope of the present invention.

What is claimed is:

1. A device for exposing a wafer to a charged-particle beam after shaping a cross section of said charged-particle beam generated from a generator by passing said charged-particle beam through at least one aperture, said device comprising:

an electromagnetic lens for forming a cross-over image;

a first plate having a round aperture for shaping a cross section of said charged-particle beam by cutting off a peripheral portion of said cross-over image; and a second plate having a beam-reduction aperture for reducing a current amount of said charged-particle beam, said second plate being located further upstream than said first plate with respect to said charged-particle beam, wherein said charged-particle beam is directed to said at least one aperture after passing through said round aperture.

2. The device as claimed in claim 1, further comprising:

blanking means for deflecting said charged-particle beam for blanking said charged-particle beam; and a third plate having a blanking aperture, said charged-particle beam being deflected away from said blanking aperture by said blanking means and being blocked by said third plate, wherein a cross-sectional size of said charged-particle beam having said cross section shaped by said round aperture is about the same size at said blanking aperture as a size of said blanking aperture.

3. The device as claimed in claim 1, wherein a size of said beam-reduction aperture is such that said charged-particle beam passing through said round aperture at an angle dependent on a size of said beam-reduction aperture covers said at least one aperture with substantially a uniform distribution of said charged-particle beam.

4. The device as claimed in claim 3, wherein said beam-reduction aperture comprises an aperture of a round shape.

5. The device as claimed in claim 1, wherein said first plate and said second plate comprise molybdenum.

6. The device as claimed in claim 1, further comprising:

first deflection means for deflecting said charged-particle beam to pass said charged-particle beam through said round aperture; and second deflection means for deflecting said charged-particle beam to pass said charged-particle beam through said beam-reduction aperture.

7. The device as claimed in claim 1, further comprising means for cooling said second plate.

8. The device as claimed in claim 1, further comprising:

a first chamber containing said generator;

a second chamber mostly separated from said first chamber by said second plate and connected with said first chamber via said beam-reduction aperture; and a third chamber mostly separated from said second chamber by said first plate and connected with said second chamber via said round aperture, wherein inside of said first chamber has a vacuum level higher than those of said second chamber and said third chamber.

9. The device as claimed in claim 8, wherein inside of said second chamber has a vacuum level higher than that of said third chamber.

10. The device as claimed in claim 9, wherein said third chamber contains ozone.

11. A method of exposing a wafer to a charged-particle beam after shaping a cross section of said charged-particle beam generated from a generator by passing said charged-particle beam through at least one aperture, said method comprising the steps of:

a) reducing a current amount of said charged-particle beam by partially cutting off said charged-particle beam directly under said generator;

b) forming a cross-over image by using said charged-particle beam partially cut off at said step a); and c) cutting off a peripheral portion of said cross-over image to shape a cross section of said charged-particle beam, wherein said charged-particle beam is directed to said at least one aperture after said peripheral portion of said cross-over image is cut off.

12. The method as claimed in claim 11, further comprising a step of deflecting said charged-particle beam away from a round aperture to block said charged-particle beam, wherein said step c) comprises a step of cutting off a peripheral portion of said cross-over image to shape said cross section of said charged-particle beam such that a cross-sectional size of said charged-particle beam at said round aperture is about the same as a size of said round aperture.

13. The method as claimed in claim 11, wherein said step a) comprises a step of reducing a current amount of said charged-particle beam by partially cutting off said charged-particle beam directly under said generator such that said at least one aperture is covered by substantially a uniform distribution of said charged-particle beam.

* * * * *